United States Patent [19]

Appel

[11] 4,185,325
[45] Jan. 22, 1980

[54] RECURSIVE DIGITAL FILTER HAVING COEFFICIENTS EQUAL TO SUMS OF FEW POWERS OF FEW POWERS OF TWO TERMS

[76] Inventor: Jean G. Appel, 72, rue du Plateau, 92320 Chatillon, France

[21] Appl. No.: 885,437

[22] Filed: Mar. 10, 1978

[30] Foreign Application Priority Data

Feb. 27, 1978 [FR] France .................... 78 05596

[51] Int. Cl.² ............................................. G11C 13/00
[52] U.S. Cl. .................................. 365/244; 333/24 R
[58] Field of Search ............... 365/244; 333/24 R, 25

Primary Examiner—Terrell W. Fears
Attorney, Agent, or Firm—Abraham A. Saffitz

[57] ABSTRACT

Recursive digital filter deriving the samples of a filtered output signal at a present sampling instant from the samples of an input signal to be filtered at said present sampling instant and at two preceding consecutive sampling instants and from samples of said filtered output signal at said two preceding consecutive sampling instants. It comprises a first memory means and a second memory means for respectively storing the samples of the input signal at the present instant and the two preceding instants and the samples of the filtered output signal at the two preceding consecutive instants; a digital adder means; means for connecting the output of said digital adder means to said second memory means; a first digital multiplier means comprising multiplier units connecting the parts of the first memory means storing respectively the samples of the input signal at the present instant and two preceding consecutive instants to the adder means, a second digital multiplier means comprising multiplier units connecting the parts of the second memory means storing respectively the samples of the filtered output signal at the two preceding consecutive instants to the adder means and a third digital multiplier means comprising a last multiplier unit connecting the adder means to the filter output. All the multiplier units are powers of two multiplier units and the last multiplier unit multiplies by a negative power of two greater than five.

36 Claims, 30 Drawing Figures $$H_1(p) = \frac{1}{1 + \frac{2\eta p}{\omega_c} + \frac{p^2}{\omega_c^2}}$$

$\eta = \frac{1}{\sqrt{2}}$ $$H_2(p) = \frac{p^2}{\omega_c^2}$$

$$H(p) = H_1(p) \times H_2(p)$$

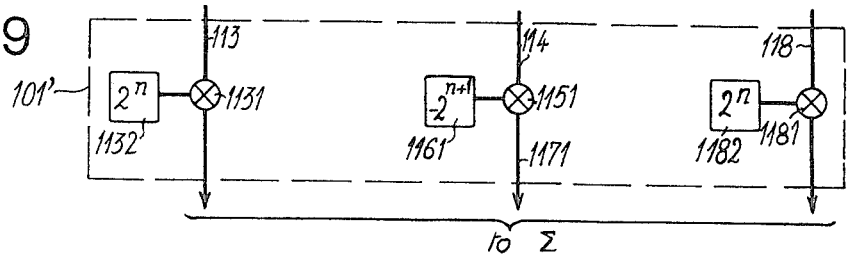
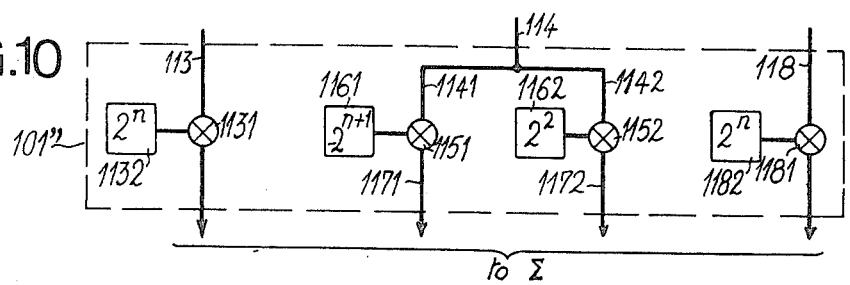
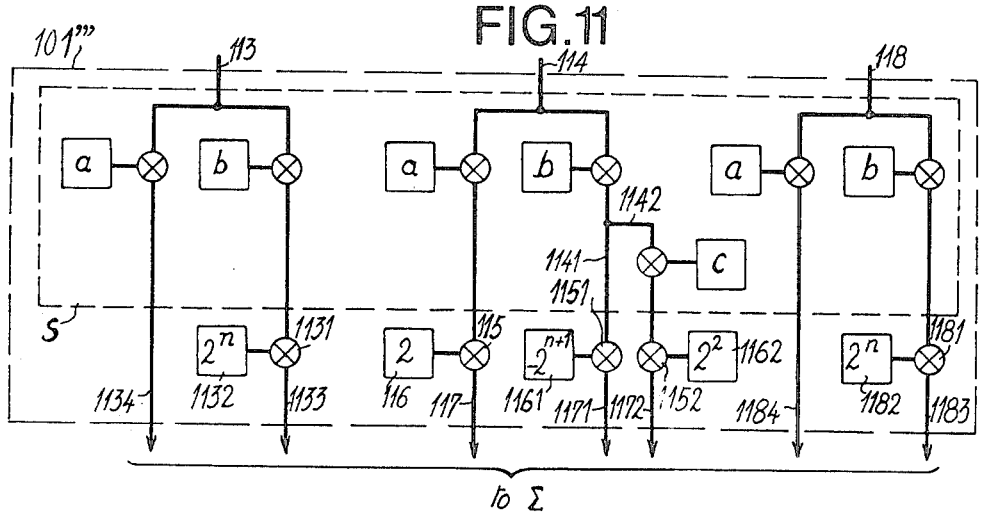
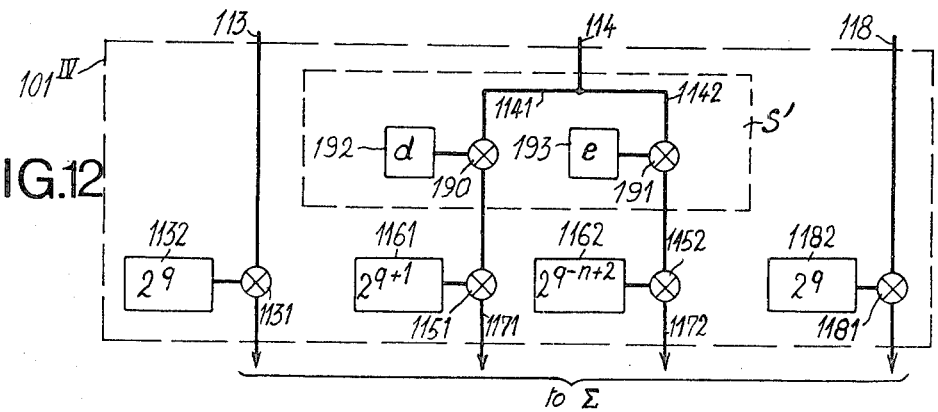

FIG. 26

| FILTER TYPE | $k_1$ | $k_2=k_4$ | $k_3$ | $k_5$ | $i_1$ | $i_2$ | $i_3$ | $i_4$ | $i_5$ | $n$ | X INPUT | INPUT Σ SIGN | OUTPUT Σ SIGN | |
|---|---|---|---|---|---|---|---|---|---|---|---|---|---|---|
| Low-Pass $\eta=0$ | / | / | / | / | 0 | 0 | C | 0 | 0 | Even or odd | $2^0$ | — | + | $(\epsilon_1,\epsilon_2)=(0,4)$ |
| Low-pass $\eta\simeq 0.5$ | / | $\frac{n-2}{2}$ | n-2 / n-2 / n-1 / n-2 | / n-2 / n-1 / n-3 | 0 | C | 0 / C / C / C | C | C / 0 / C / C | Even | $2^0$ | — / — / — / + | + | $(\epsilon_1,\epsilon_2)=(-4,0)$ |
| Low-pass $\eta\simeq 1/\sqrt{2}$ | / | $\frac{n-3}{2}$ | / n-2 / n-1 / n-2 | / n-2 / n-1 / n-3 | 0 | C | 0 / C / C / C | C | C / 0 / C / C | Odd | $2^0$ | — / — / — / + | + | $(\epsilon_1,\epsilon_2)=(-2,2)$ |
| Low-pass $\eta\simeq 1$ | / | $\frac{n-4}{2}$ | / n-2 / n-1 / n-2 | / n-2 / n-1 / n-3 | 0 | C | 0 / C / C / C | C | C / 0 / C / C | Even | $2^0$ | — / — / — / + | + | $(\epsilon_1,\epsilon_2)=(4,8)$ |
| High-pass $\eta\simeq 1/\sqrt{2}$ | / | $\frac{n-3}{2}$ | / n-2 / n-1 / n-2 | / n-2 / n-1 / n-3 | 0 | C | C / C / C | C | C / C / C | Odd | $2^n$ | — / — / + | — | |
| Rejection $\eta\simeq 1/\sqrt{2}$ | n-2 | $\frac{n-3}{2}$ | / n-2 / n-1 / n-2 | / n-2 / n-1 / n-3 | C | C | C / C / C | C | C / C / C | Odd | $2^n$ | — / — / + | — | |

O = Open    C = Closed

RECURSIVE DIGITAL FILTER HAVING COEFFICIENTS EQUAL TO SUMS OF FEW POWERS OF FEW POWERS OF TWO TERMS

BACKGROUND OF THE INVENTION

1. Field of the Invention

The present invention concerns, generally speaking, digital filtering and centers around a recursive digital filter which delivers, from digitized samples of an analog input signal, a series of numbers representing the digitized values of the filtered analog signal. More particularly, the invention concerns low-pass, high-pass or rejection recursive digital filters the recurrence relationship coefficients of which are formed by a small number of combinations of powers of two.

In accordance with a preferred embodiment of the invention, the recursive digital filter is a second order filter of the Butterworth type with a damping coefficient $\eta$ equal to $1/\sqrt{2}$. Another preferred embodiment refers to a first order recursive digital filter with coefficients of powers of two.

A further preferred embodiment concerns second order recursive digital filters in which the coefficients of the recurrence relationship of the filter are expressed in the form of sums of a small number of terms equal to a power of two and in which the damping factor $\eta$ can equal in particular, 0, $\frac{1}{2}$, $1/\sqrt{2}$ and 1, and more generally $2^{k/2}$ where k is an integer.

Other embodiments of the present invention make it possible to perform the synthesis of various types of filters such as, for example, those of Bessel, Legendre or Tchebyscheff.

The recursive digital filters of the invention with power of two coefficients have filtering rates in real time a thousand times faster than those achieved by means of conventional minicomputers equiped with a wired or microprogrammed floating point calculation module.

The time required by the filters of the invention to calculate a filtered point is of the order of a few hundreds of nanoseconds which allows an increased rate of the analog input signal sampling and minimizes the influence of spectrum overlap. The low calculation time also allows several digital filter modules of a similar or of differing types to be placed in series enabling transfer functions of a more general nature to be obtained.

The filters on the invention can advantageously replace analog filters when the necessary cut-off frequencies are very low. In actual fact, on the strength of their performance, ease of development and cost price, they should find a wide range of applications wherever the characteristics of analog filters prove to be insufficient, which is essentially the case of low-pass filtering with very low cut-off frequencies.

The low-pass filtering of measuring signals is poorly resolved by analog filters when cut-off frequencies drop below 1 Hz. The analog filters available for these frequencies lack stability and are not easily reproducible as regards phase response; moreover, the cost price is high. Digital filters, on their other hand, are well suited to the filtering of very low frequencies: they do not drift and, for a given calculation algorithm, present a perfectly defined phase response.

A digital filter can operate either in delayed time or in real time. It is said to operate in real time if the calculation of a filtered point at a given moment in time only resorts to input analog signal samples corresponding to previous moments in time or equal to the given moment. Furthermore, the calculation time of a filtered point must be less than the sampling period. The advantage of operating in real time is apparent, for instance, in the reduction of the volume of data to be transmitted to a central data processing computer, or else in the possibility of including the data acquisition and pre-processing system in a control loop.

It is a known fact that if it is desired to sample a signal at a sampling frequency $f_e$, the signal to be sampled should not contain any frequency components greater than $f_e/2$ so as to obviate any spectrum overlap. It is thus essential, before sampling the signal and filtering it digitally, to conduct an analog prefiltering process in order to eliminate the signal components with frequencies greater than half the sampling frequency. By way of illustration, let us take the case of a second order low-pass analog pre-filtering stage with a cut-off frequency of 10 Hz and a $-40$ dB per decade attenuation. We then find that, to digitally filter frequency components of the signal with a given accuracy of $10^{-2}$, $10^{-3}$ or $10^{-4}$, for instance, we must maintain the frequencies below 100, 300 or 1000 Hz respectively in the analog pre-filtering stage. This imposes sampling frequencies, $f_e$, of 200, 600 and 2000 Hz respectively.

2. Description of the Prior Art

E. Haziza and J. Appel's article entitled "The real time filtering of measurements carried out in the windtunnel" (NT Office National d'Etudes et de Recherches Aerospatiales, 3/7146 PY) shows to what extent a minicomputer used for measurement, data acquisition and storage is also capable of digitally filtering in real time the signals obtained. The programmed filter is a second order low-pass recursive filter and the digital filtering capacity in real time of the minicomputer is 8 measurement channels each one of which is sampled 200 times per second.

It is immediately obvious that when the desired accuracy level is high ($10^{-4}$ for example) and the number of channels to be filtered is substantial (of the order of a few tens) such an acquisition and storage minicomputer is no longer able to carry out real time digital filtering conventionnally.

SUMMARY OF THE INVENTION

The principal object of this invention is to provide a recursive digital filter having a very low calculation time of a filtered point compared to filters hitherto available. The decrease in the calculation time of the recurrence relationship, and chiefly in the time taken in multiplying, is obtained by replacing the recurrence relationship coefficients by a combination, reduced in number, of powers of two. The multiplications by the recurrence relationship coefficients are then reduced to multiplications by $2^n$ and are carried out by bit shifting.

These multiplications are performed either by multipliers of the shift register type linked to coefficient registers containing the necessary powers of two, or, in a special preferred embodiment, by wiring up to a data transfer "bus" line.

A preferred embodiment of this invention is a second order low-pass recursive digital filter, of the Butterworth type. Before describing this filter in detail, we shall establish the recurrence relationship and determine what are the best $2^n$ type forms to be given its coefficients.

The analog transfer function of a second order low-pass filter is written:

$$H(p) = \left[ 1 + 2\eta \frac{p}{\omega_c} + \frac{p^2}{\omega_c^2} \right]^{-1} \quad (1)$$

where p is the Laplace variable, $\eta$ is the damping factor and $\Omega_c$ the angular cut-off frequency. By applying the following conformal transform to the function H (p)

$$p = \frac{1}{\Delta t} \frac{1 - z^{-1}}{1 + z^{-1}} \quad (2)$$

where $\Delta t$ is the sampling period and $z = e^{p\Delta t}$, we obtain the transfer function of the filter in terms of z:

$$H(z) = \frac{A_o + A_1 z^{-1} + A_2 z^{-2}}{1 - B_1 z^{-1} + B_2 z^{-2}} \quad (3)$$

Taking $\alpha = \Omega_c \Delta t$, the coefficients $A_o$, $A_1$, $A_2$, $B_1$ and $B_2$ are defined by the following equations:

$$A_o = \frac{\alpha^2}{1 + 2\eta\alpha + \alpha^2} \quad (4)$$

$$A_1 = 2 A_o \quad (4')$$

$$A_2 = A_o \quad (4'')$$

$$B_1 = \frac{2(1 - \alpha^2)}{1 + 2\eta\alpha + \alpha^2} \quad (5)$$

$$B_2 = \frac{1 - 2\eta\alpha + \alpha^2}{1 + 2\eta\alpha + \alpha^2} \quad (6)$$

$E_o(z)$ being the output signal of the filter in terms of z and $E_i(z)$ the input signal, we know that $$H(z) = E_o(z)/E_i(z) \quad (7)$$

and the recurrence relationship can be deduced as $$E_o(z) = B_1 E_o(z) z^{-1} - B_2 E_o(z) z^{-2} + A_o E_i(z) + \quad (8)$$
$$A_1 E_i(z) z^{-1} + A_2 E_i(z) z^{-2}$$

This relationship (8) can be represented graphically by the prior art filter diagram in FIG. 1. In FIG. 1, the input function $E_i(z)$ is multiplied, via the multiplier circuit 1, by coefficient $A_o$ to give $A_o E_i(z)$ and, via the multiplier circuit 2 (in fact a delay circuit), by the function $z^{-1}$ to give $E_i(z)z^{-1}$. The signal $E_i(z)z^{-1}$ is multiplied, via the multiplier circuit 3, by coefficient $A_1$ to give $A_1 E_i(z)z^{-1}$ and, via multiplier circuit 4, by the signal $z^{-1}$ to give $E_i(z)z^{-2}$. The function $E_i(z)z^{-2}$ is multiplied, via multiplier circuit 5, by coefficient $A_2$ to give $A_2 E_i(z)z^{-2}$. The output function $E_o(z)$ is multiplied, via multiplier circuit 6, by $z^{-1}$ to give $E_o(z)z^{-1}$ which is itself multiplied, via multiplier circuits 7 and 8, to give $B_1 E_o(z)z^{-1}$ and $E_o(z)z^{-2}$ respectively. The function $E_o(z)z^{-2}$ is multiplied, via multiplier circuit 9, by coefficient $(-B_2)$ to give the function $-B_2 E_o(z)z^{-2}$. The adder circuit 10 adds the five signals corresponding to the five terms on the right hand side of equation (8) and delivers the output function $E_o(z)$ at its output. The filter diagram in FIG. 1 is termed a direct structure diagram because it derives directly from the transfer function (3). This direct structure is employed by certain preferred embodiments of second order recursive filters with coefficients formed of a small number of terms equal to powers of two.

If we now return to equation (7) and introduce an intermediate function F(z) as follows:

$$H(z) = \frac{E_o(z)}{F(z)} \cdot \frac{F(z)}{E_i(z)} \quad (9)$$

then by combining equations (3) and (9), we can write two coupled functional relationships:

$$E_o(z) = F(z)A_o = F(z)A_1 z^{-1} + F(z)A_2 z^{-2} \quad (10)$$

$$F(z) = E_i(z) + F(z)B_1 z^{-1} - F(z)B_2 z^{-2} \quad (11)$$

These two relationships (10) and (11) may be represented graphically by the prior art filter diagram in FIG. 2 which is referred to as a canonical structure diagram. In FIG. 2, the input function $E_i(z)$ is applied directly to an adder circuit 11 whose output delivers the intermediate function F(z). This functions F(z) is multiplied, via multiplier circuits 12 and 13, by the coefficient $A_o$ and the function $z^{-1}$ respectively to give the respective functions $A_o F(z)$ and $F(z)z^{-1}$. The function $F(z)z^{-1}$ is multiplied, via the multiplier circuits 14, 15 and 16, by the coefficients $A_1$ and $B_1$ and by the function $z^{-1}$ respectively to give the functions $A_1 F(z)z^{-1}$, $B_1 F(z)z^{-1}$ and $F(z)z^{-2}$. The function $F(z)z^{-2}$ is multiplied, via the multiplier circuits 17 and 18, by the coefficients $A_2$ and $(-B_2)$ respectively to give $A_2 F(z)z^{-2}$ and $-B_2 F(z)z^{-2}$. The adder circuit 11 receives the three functions on the right hand side of equation (11) and delivers, as already mentioned, the intermediate function F(z) at its output. An adder circuit 19 receives the three functions on the right hand side of equation (10) and delivers the output function $E_o(z)$ at its output. This canonic structure in the filter diagram of FIG. 2 is employed in certain preferred embodiments of second order recursive digital filters with coefficients formed of a reduced number of combinations of powers of two.

By comparing FIGS. 1 and 2, it can be seen that the canonic structure of the diagram in FIG. 2 contains two $z^{-1}$ multiplier circuits instead of four and two adder circuits instead of one.

In practice, filter designs based on the theoretical diagrams in FIGS. 1 and 2 would include the same number of multiplier circuits, namely five, and would further comprise four memories plus one adder circuit in the case of the direct structure (FIG. 1) and two memories plus two adder circuits in the canonic structure case (FIG. 2).

Both the direct structure (FIG. 1) and the canonic structure can be built either in parallel or series form. In parallel form, the memories used are registers having as many inputs and as many outputs as the information they contain has bits. Similarly, the adder circuits used in parallel have as many inputs as the information to be added has bits. The multiplications by coefficients equal to powers of two are achieved through wiring by shifting the output terminals with respect to the input terminals of the parallel-mounted registers. A multiplication by $2^k$, for example, is executed by shifting the bits of the binary number to be multiplied of k bits towards the left; a multiplication by $2^{-k}$ is executed by a shift of k bits towards the right.

So as to minimize the size of the parallel-arranged adder circuit used, the shifted information that it must sum up is transmitted to it successively by means of a bus line. An accumulator is therefore associated with the adder. The filters based on a direct structure in this application are mounted in parallel arrangement.

This parallel arrangement can be transformed into a canonic one with no difficulty. It should be pointed out that a parallel arrangement makes it possible to perform the calculation of a filtered point at maximum rate. If maximum rate is sought, let us consider which structure should be adopted to minimize the number of components.

TABLE I

|  | Direct structure | Canonic structure |
|---|---|---|
| Multipliers | 5 | 5 |
| Adders | 1 | 2 |
| Memories | 4 | 2 |

Referring to table I, it can be seen that the canonic structure results in two fewer memories but one more adder circuit than to the direct structure. Now, the number of circuits required for produce an extra parallel adder is well above the number of circuits necessary for the two additional input memories. Consequently, if we wish to optimize speed of execution, it is preferable to choose a parallel arrangement combined with a direct structure.

In any event, a series arrangement leads to a smaller number of components than in a parallel-mounted one. If, therefore, a reduction in the number of components used is being sought rather than speed, a series arrangement would be preferred. However, contrary to the preceding case, for a series arrangement, the number of components required for a second series adder circuit is less than the number of components needed for two additional memories.

With a view to optimizing the number of components used in the construction of a filter, in the case of a series arrangement, the canonic structure will be therefore more advisable. In this series case, the memories consist of shift registers and the adders of series-mounted adders.

We are now going to examine the best forms to be given the coefficients in the recurrence relationship by breaking them down into reduced number combinations of powers of two.

The analog angular cut-off frequency, $\Omega_c$, and the digital angular cut-off frequency, $\Omega'_c$, are related by the relationship $$\omega_c \Delta t = \tan(\omega'_c \Delta t / 2) \quad (12)$$

as a result of the conformal transform (2).

For digital cut-off frequencies $f_c' = \omega_c'/2\pi$ of the order of 1 Hz and sampling frequencies $f_c = 1/\Delta t$ of the order of 1000 Hz, the quantity $\omega_c' \Delta t / 2$ is of the order of $3 \cdot 10^{-3}$ and equation (12) can be simplified to $$\Omega_c \Delta t \simeq \omega_c' \Delta t / 2 \quad (12')$$

Equation (12') denotes that, within the range of frequencies examined, the cut-off frequency of the digital filter is twice that of the corresponding analog filter and the quantity $\alpha = \omega_c \Delta t$ is very small compared to unity. Consequently, the coefficient $A_o$ in equation (4) is of the order of $\alpha^2$, i.e. about $10^{-5}$, whereas the coefficients $B_1$ and $B_2$ in equations (5) and (6) approximate to a little less than 2 and 1 respectively. Calculating the recurrence relationship (8) by minicomputer for coefficients of these orders of magnitude is necessarily lengthy a few hundreds of microseconds—an elementary floating point operation requiring a time lapse of about 35 $\mu$s.

The principle on which the invention is based is to reduce the calculation time for the recurrence relationship (8) or for the two coupled relationships (10) and (11) and, chiefly, the time devoted to multiplications, by arbitrarily fitting the coefficient $A_o$ equal to $2^{-n}$ where n is large, and by determining the values of $B_1$ and $B_2$ using the condition on the gain of the filter and the damping coefficient $\eta$. The condition on the gain of the filter at zero frequency is obtained by summing the coefficients on the right hand side of the recurrence relationship (8) and taking account of equations (4') and (4''):

$$4A_o = B_1 - B_2 = 1 \quad (13)$$

this equation indicating that the gain of the filter, for a direct current component of the signal, is equal to unity. Furthermore, by resolving equation (4) with respect to $1/\alpha^2$ and combining equations (4) and (5), we find the relationship expressing $B_1$ in terms of $A_o$ and $\eta$; equation (13) then allows us to write $B_2$ in terms of $A_o$ and $\eta$:

$$B_1 = A_o \left[ \frac{2}{A_o} + 4(\eta^2 - 1) - \frac{4\eta}{\sqrt{A_o}} \sqrt{1 + (\eta^2 - 1)A_o} \right] \quad (14)$$

$$B_2 = A_o \left[ \frac{1}{A_o} + 4\eta^2 - \frac{4\eta}{\sqrt{A_o}} \sqrt{1 + (\eta^2 - 1)A_o} \right] \quad (15)$$

Relationships (14) and (15) are exact expressions; within the frequency range examined, we saw that the coefficient $A_o$ is of the order of $10^{-5}$ which allows the quantity $\sqrt{1 + (\eta^2 - 1)A_o}$ to be approximated to one, the quantity $4(\eta^2 - 1)$ in equation (14) to $\epsilon_1$ and the quantity $4\eta^2$ in equation (15) to $\epsilon_2$. The quantities $\epsilon_1$ and $\epsilon_2$ are related by the equation $\epsilon_1 - \epsilon_2 = -4$ and are each chosen to be equal to a given power of two. Under the foregoing assumptions, for all values of the damping factor $\eta$ expressed in the form of a whole or half power of two $$\eta = 2^{k/2} \text{ where k is an integer} \quad (16)$$

the expressions (14) and (15) take the form of sums of terms all of which are powers of two never and which do not exceed three in number. of two.

The coefficients $A_o$, $A_1$, $A_2$, $B_1$ and $B_2$ for a second order low-pass filter of the invention are equal to:

$$\begin{aligned} A_o &= 2^{-n} \\ A_1 &= 2^{-n+1} \\ A_2 &= 2^{-n} \end{aligned} \quad (17)$$

$$B_1 = 2^{-n}\left[2^{n+1} - 2^{\frac{n+4+k}{2}} + \epsilon_1\right]$$

$$B_2 = 2^{-n}\left[2^n - 2^{\frac{n+4+k}{2}} + \epsilon_2\right]$$

where the different values of the pair $(\epsilon_1, \epsilon_2)$ are grouped together in table II below:

TABLE II

| $\epsilon_1$ | 0 | −4 | −2 | 4 |
|---|---|---|---|---|
| $\epsilon_2$ | 4 | 0 | 2 | 8 |

If $\epsilon_2$ can be chosen to be equal to $4\eta^2$, there will be no approximation arising from the terms $\epsilon_1$ and $\epsilon_2$ in the calculation of $B_1$ and $B_2$.

Each of these pairs of values $(\epsilon_1, \epsilon_2)$ lead to a value of the damping coefficient $\eta$ which differs slightly from the theoretical value of $\eta = 2^{k/2}$ in equation (16). This is due to the fact that the expressions (17) for $B_1$ and $B_2$ are approximations of equations (14) and (15). The damping coefficient is related to the values of the coefficients $A_o$ and $B_1$ by the relationship $$\eta = \frac{2 - B_1 - 4A_o}{2\sqrt{2A_o(2A_o + B_1)}} \quad (18)$$

which is obtained from equations (4) and (5). For values of $A_o$ and $B_1$ given by the expressions (17), the true damping coefficient of the filter can be rewritten as:

$$\chi\text{true}_\eta{}^\nu = \frac{2^{(n+4+k)/2} - 4 - \epsilon_1}{2\sqrt{2(2 + 2^{n+1} - 2^{(n+4+k)/2} + \epsilon_1)}} \quad (19)$$

The values of the true damping coefficients of the filters in the invention having coefficients given by the expressions (17) for various values of the theoretical damping coefficient $2^{k/2}$ and the various values of the pair $(\epsilon_1, \epsilon_2)$, for $n = 19$ or $20$, can be seen in table III below.

TABLE III

| n | k | theoretical $\eta$ $=2^{k/2}$ | true $\eta$ $(\epsilon_1,\epsilon_2)=(0,4)$ | true $\eta$ $(\epsilon_1,\epsilon_2)=(-4,0)$ | true $\eta$ $(\epsilon_1,\epsilon_2)=(-2,2)$ | true $\eta$ $(\epsilon_1,\epsilon_2)=(4,8)$ |
|---|---|---|---|---|---|---|
| 20 | $-\infty$ | 0.00000 | ($\eta < 0$) | 0.00000 | ($\eta < 0$) | ($\eta < 0$) |
| 20 | −2 | 0.50000 | 0.49927 | 0.50024 | 0.49976 | 0.49829 |
| 19 | −1 | 0.70711 | 0.70641 | 0.70779 | 0.70711 | 0.70503 |
| 20 | 0 | 1.00000 | 1.00000 | 1.00097 | 1.00048 | 0.99902 |
| 19 | 1 | 1.41421 | 1.41560 | 1.41699 | 1.41629 | 1.41421 |
| 20 | 2 | 2.00000 | 2.00294 | 2.00392 | 2.00343 | 2.00196 |

The values of k appearing in table III provide the damping factor values used the most frequently. However, all other values of k providing smaller or larger damping factors result in filters which are just as easily designable. Table III makes it possible to check that the true values of the damping factors for the various values of the pair $(\epsilon_1, \epsilon_2)$ are practically equivalent for $n = 19$ or 20. In the event of n being sufficiently large for the choice of the pair $(\epsilon_1, \epsilon_2)$ to be more or less immaterial, the values $(0,4)$ or $(-4,0)$ are preferable to the values $(-2,2)$ and $(4, 8)$ since they minimize the number of powers of two in the two coefficients $B_1$ and $B_2$, respectively. If we want to build a low-pass recursive digital filter whose damping factor is very close to that of a Butterworth filter, where $\eta = 1/\sqrt{2}$, then the coefficients $A_0$, $A_1$, $B_1$ and $B_2$ (in expressions (17)) of the z-transform (3) can be rewritten for the choice of $(\epsilon_1, \epsilon_2) = (0,4)$ as:

$$A_o = 2^{-n} \quad (20)$$
$$A_1 = 2^{-n+1}$$
$$A_2 = 2^{-n}$$

$$B_1 = 2^{-n}\left\{2^{n+1} - 2^{\frac{n+3}{2}}\right\}$$

$$B_2 = 2^{-n}\left\{2^n - 2^{\frac{n+3}{2}} + 2^2\right\}$$

By substituting the expressions (20) to the relationship (8), the recurrence formula for the second order low-pass recursive digital filter, of the Butterworth type, according to this invention and based on a direct structure, becomes:

$$2^n y_i = \left(2^{n+1} - 2^{\frac{n+3}{2}}\right)y_{i-1} - \left(2^n - 2^{\frac{n+3}{2}} + 2^2\right)y_{i-2} \quad (21)$$
$$+ x_i + 2x_{i-1} + x_{i-2}$$

where $x_i$, $x_{i-1}$, $x_{i-2}$ are the sampled values of the input analog signal at instants $i\Delta t$, $(i-1)\Delta t$, $(i-2)\Delta t$ respectively and $y_i$, $y_{i-1}$, $y_{i-2}$ are the corresponding filtered values. The integer $\eta$ must be odd for the power $(n+3)/(2)$ also to be an integer.

A recursive digital filter is stable if all the poles of its transfer function $H(z)$ lie inside a circle of radius unity. the two poles of the transfer function corresponding to the recurrence formula (21) have moduli of value $[2^2 + 2^{(4-n)} - 2^{(7-n)/2}]^{\frac{1}{2}}$ and the recursive filter derived from (21) is stable whatever the value of the integer $\eta \geq 0$.

By inverting equations (4) and (5) and taking into account the values of $A_0$ and $B_1$, we find that $$\alpha^2 = \frac{2A_o}{2A_o + B_1} \approx \frac{2A_o}{B_1} = \frac{1}{2^n - 2^{(n+1)/2}} \quad (22)$$

the analog cut-off frequency $f_c = \omega_c/2\pi = \alpha f_e/2\pi$ corresponding to the recursive filter which obeys the recurrence relationship (21) is therefore given by $$f_c \approx \frac{f_e}{2\pi} \cdot \frac{1}{\sqrt{2^n - 2^{(n+1)/2}}} \quad (23)$$

The cut-off frequency $f_c$ thus depends on the value of the integer $\eta$ chosen and varies, as a rule, in a discontinuous manner. However, $f_c$ is proportional to the sampling frequency $f_e$ and it is possible to modify the latter slightly in such a way that the cut-off frequency may be adjusted to a desired value.

Up to this point, we have studied the case of second order low-pass recursive digital filters. We are now going to show how, starting from the z-transform of a second order low-pass filter of the invention, to calculate the z-transforms for high-pass and rejection filters complying with the invention.

As shown in FIGS. 3A, 3B and 3C, it is possible to regard a high-pass filter transfer function H(p) as the result of placing a low-pass filter with a transfer function $H_1(p)$ and angular cut-off frequency $\omega_{1c}$ in series with a filter with a transfer function $H_2(p)=p^2/\omega_{2c}^2$ where $\omega_{2c}=\omega_{1c}$. If we take as a low-pass filter, a second order filter according to the invention, with a small number of coefficients in the form of sums of powers of two, the z-transform $H_1(z)$ is given by equation (3) where the coefficients $A_0$, $A_1$, $A_2$, $B_1$ and $B_2$ are given by the expressions (17). According to equation (22), the analog angular frequency $\omega_{1c}$ is approximately equal to $$\omega_{1c} \simeq \frac{f_e}{\sqrt{2^n - 2^{(n+2+k)/2}}} \quad (24)$$

By applying the conformal transform (2) to the function $H_2(p)$, the z-transform for the high-pass filter is obtained:

$$H(z) = \frac{A_o}{(\omega_{2c}\Delta t)^2} \cdot \frac{1 - 2z^{-1} + z^{-2}}{1 - B_1 z^{-1} + B_2 z^{-2}} \quad (25)$$

If the coefficient $A_o/(\omega_{2c}\Delta t)^2$ is equal to one, a slight difference between the angular cut-off frequencies $\omega_{1c}$ and $\omega_{2c}$ is introduced since then $$\omega_{2c} = f_e/\sqrt{2^n} \quad (26)$$

From table IV below, for a Butterworth filter ($k=-1$), it can be seen that the relative difference between the two angular cut-off frequencies is small once the odd integer n is greater than 9.

TABLE IV

| n | 7 | 9 | 11 | 13 | 15 | 17 |
|---|---|---|----|----|----|----|
| $\frac{\omega_{1c} - \omega_{2c}}{\omega_{2c}}$ | 7% | 3% | 1.6% | 0.8% | 0.4% | 0.2% |
| $g_m$(dB) | 1 | 0.5 | 0.25 | 0.12 | 0.06 | 0.03 |

FIG. 4 shows qualitatively, when $\omega_{1c}$ is slightly greater than $\omega_{2c}$, that the gain of the filter in the passband $g_m$ is fractionally above zero decibel. The maximum value of this gain, $g_m$, is calculated for an analog frequency of half the sampling frequency, i.e. for $z = e^{j\pi} = -1$. The transfer function H(z) for this value of $z = -1$ is equal to $4(1+B_1+B_2)^{-1}$ or $$H(-1) = \quad (27)$$

$$\frac{1}{1 - 2^{(2+k-n)/2} + 2^{-(n+2)}(\epsilon_1 + \epsilon_2)} \simeq 1 + \frac{1}{2^{(n-k-2)/2}}$$

The values of $g_m$ in decibels are given for different values of n in the table above when $k = -1$, i.e. for a Butterworth filter, and the gains are seen to be very close to zero decibel for $n \geq 15$. This justifies the approximation of taking $A_o(\omega_{2c}\Delta t)^{-2}$ equal to one in the transfer function (25).

The recurrence formula of a high-pass Butterworth filter of the invention, with coefficients formed by the sum of a small number of powers of two, based on a direct structure is thus written, for $(\epsilon_1, \epsilon_2) = (0,4)$, as:

$$2^n y_i = [2^{n+1} - 2^{(n+3)/2}] y_{i-1} - \quad (28)$$
$$[2^n - 2^{(n+3)/2} + 2^2] y_{1-2} + 2^n(x_i - 2x_{i-1} + x_{1-2})$$

We are now going to deal with the synthesis of a rejection filter conforming with the principle of the invention. As shown in FIG. 5, it is possible to consider a rejection filter with a transfer function H(p) as the result of placing in series a low-pass filter with a transfer function $H_1(p)$ with an angular cut-off frequency $\omega_{1c}$ and a filter with a transfer function $H_2(p) = 1 + (p^2/\omega_{2c}^2)$, where $\omega_{2c} = \omega_{1c}$.

A second order filter of the invention with coefficients formed by the sum of a small number of powers of two is taken as a low-pass filter and $H_1(z)$ is given by equation (3) the coefficients being given by the expressions (17) and $\omega_{1c}$ by equation (24).

By applying the conformal transform (2) to the function $H_2(p)$, the z-transform of the rejection filter is written:

$$H(z) = A_o\left[1 + \frac{1}{(\omega_{2c}\Delta t)^2}\right] \frac{1 - 2\frac{1 - \frac{(\omega_{2c}\Delta t)^2}{1 + (\omega_{2c}\Delta t)^2}}{z^{-1} + z^{-2}}}{1 - B_1 z^{-1} + B_2 z^{-2}} \quad (29)$$

We can impose the condition $$A_o\left[1 + \frac{1}{(\omega_{2c}\Delta t)^2}\right] = 1 \quad (30)$$

which, up to the first order in $\alpha$, is the same as the condition that was imposed on the high-pass filter. The discussion and the validity of this approximation are identical to those of the high-pass filter case.

Under the terms of condition (30), the z-transform (29) of the rejection filter becomes:

$$H(z) = \frac{1 - \frac{2^{n+1} - 2^2}{2^n} z^{-1} + z^{-2}}{1 - B_1 z^{-1} + B_2 z^{-2}} \quad (31)$$

The recurrence relationship a Butterworth type of rejection filter of the invention with coefficients formed by the sum of a small number of powers of two is as follows for $(\epsilon_1, \epsilon_2) = (0,4)$:

$$2^n y_i = (2^{n+1} - 2^{(n+3)/2})y_{i-1} - (2^n - 2^{(n+3)/2} + 2^2)y_{i-2} + \quad (32)$$
$$nx_i - (2^{n+1} - 2^2)x_{i-1} + 2^n x_{i-2}$$

The recurrence formulae (21), (28) and (32) have been established for Butterworth type low-pass, high-pass and rejection second order recursive digital filters respectively. The formulae are very similar and differ only by the values of the coefficients of $x_i$, $x_{i-1}$ and $x_{i-2}$. They may be grouped together in a single recurrence relationship:

$$2^n y_i = [2^{n+1} - 2^{(n+3)/2}]y_{i-1} - [2^n - 2^{(n+3)/2} + 2^2]y_{i-2} + \quad (33)$$
$$(a + b\, 2^n) x_i + [2a + b(-2^{n+1} + c\, 2^2)]x_{i-1} + (a + b\, 2^n) x_{i-2}$$

with $a=1$, $b=0$, $c=0$ for a low-pass filter, $a=0$, $b=1$, $c=0$ for a high-pass filter, $a=0$, $b=1$, $c=1$ for a rejection filter. The gain $g_o$ at zero frequency is therefore given by $$g_0 = a + bc \quad (34)$$

and the gain $g_m$ at half the sampling frequency is given by $$g_m = b \frac{1 - c2^{-n}}{1 - 2^{(1-n)/2} + 2^{-n}} \approx b\left(1 + \frac{1}{2^{(n-1)/2}}\right) \quad (35)$$

Equation (33) which combines the 3 recurrence formulae (21), (28) and (32) can be parameterized in different ways. We take an example of parameterization which generalizes the recurrence relationships (21), (28) and (32) for gains which differs from one:

$$2^n y_i = (2^{n+1} - 2^{(n+3)/2}) y_{i-1} - (2^n - 2^{(n+3)/2} + 2^2) y_{i-2} + 2^{q-n} \{2^n x_i + (2^{n+1} d + 2^2 e) x_{i-1} + 2^n x_{i-2}\} \quad (33')$$

where q is an integer and with $d=1$, $e=0$ for a low-pass filter, $d=-1$, $e=0$ for a high-pass filter and $d=-1$, $e=1$ for a rejection filter. The gain $g_0$ at zero frequency is thus $$g_0 = 2^{q-n}[2^{n-1}(1+d) + e] \quad (34')$$

which gives $2_q$ for a low-pass filter and $2^{q-n}$ for a rejection filter and, of course, zero for a high-pass filter. The gain $g_m$ at half the sampling frequency is given by $$g_m = \frac{2^{q-n}[2^{-1}(1-d) - 2^{-n} e]}{1 - 2^{(1-n)/2} + 2^{-n}} \approx 2^{q-n-1}(1-d)\left[1 + \frac{1}{2^{(n-1)/2}}\right] \quad (35')$$

and is equal to approximately $2^{q-n}$ for high-pass and rejection filters when n is fairly large ($n \geq 11$). Such a parameterization of equation (33') corresponds to the recurrence formulae (21), for $d=1$, $e=0$, $q=0$, (28), for $d=-1$, $e=0$, $q=n$, and (32), for $d=-1$, $e=1$, $q=n$. A different choice of the values of q enables filters having gains differing from one to be defined.

The z-transform of high-pass or rejection second order filters consistent with this invention are always expressed in the form of equation (3), the coefficients $B_1$ and $B_2$ being given by the expression (17) the values of the coefficients $A_0$, $A_1$ and $A_2$ now being given by the following expressions for a high-pass filter:

$$\begin{aligned} A_0 &= 1 \\ A_1 &= -2 \\ A_2 &= 1 \end{aligned} \quad (36)$$

and by the following expressions for a rejection filter:

$$\begin{aligned} A_0 &= 1 \\ A_1 &= -2 + 2^{2-n} \\ A_2 &= 1 \end{aligned} \quad (37)$$

From a practical point of view, the values of k equal to $-1$ and 0, corresponding to the theoretical damping factors $1/\sqrt{2}$ and 1 respectively, are most commonly used for high-pass and rejection filters.

Table V below shows the values of the coefficients $A_0$, $A_1$, $A_2$, and $B_2$ for low-pass, high-pass and rejection second order recursive digital filters of the invention with coefficients formed by the sum of a small number of powers of two and a theoretical damping factor of $2^{k/2}$ and whose z-transforms are given by equation (3).

TABLE V

| Type of filter | $A_o = A_2$ | $A_1$ | $B_1$ | $B_2$ |
|---|---|---|---|---|
| Low-pass | $2^{-n}$ | $2^{-n+1}$ | | |
| High-pass | 1 | $-2$ | $2 - 2^{\frac{k+4-n}{2}} + \epsilon_1 2^{-n}$ | $1 - 2^{\frac{k+4-n}{2}} + \epsilon_2 2^{-n}$ |
| Rejection | 1 | $-2 + 2^{2-n}$ | | |

The values to be given to the digits of the pair $(\epsilon_1, \epsilon_2)$ in table V are those of table II. The parity of n is to be selected in such a way that the quantity $n+4+k$ is always even. In the case of a Butterworth filter for which $\eta = 1/\sqrt{2}$ and $k = -1$, we find that $B_1$ is equal to $2^{-n} (2^{n+1} - 2(n+3/2 + \epsilon_1))$ and that $B_2$ is equal to $2^{-n}(2^n + 2^{(n+3)/2} + \epsilon_2)$, when the pair $(\epsilon_1, \epsilon_2) = (0, +4)$, the recurrence relationships (21), (28) and (32) are met.

BRIEF DESCRIPTION OF THE DRAWINGS

We are now going to describe in detail various preferred embodiments of the recursive digital filters of the invention with coefficients formed by the sum of a small number of powers of two, in relation to the annexed drawings, in which:

FIGS. 9 and 10 show, together with FIG. 7, design schematic of high-pass and rejection filters of the invention with coefficients formed of a small number of powers of two;

FIGS. 11 and 12 present, in conjunction with FIG. 7, design schemes of a filter with coefficients formed by the sum of a small number of powers of two, switchable to three filtering positions; low-pass, high-pass and rejection;

FIG. 26 is a summary giving the values of the parameters of the filter structure in FIG. 25 in terms of the type of filter desired and its damping factor.

DESCRIPTION OF THE PREFERRED EMBODIMENTS

Figure 1:
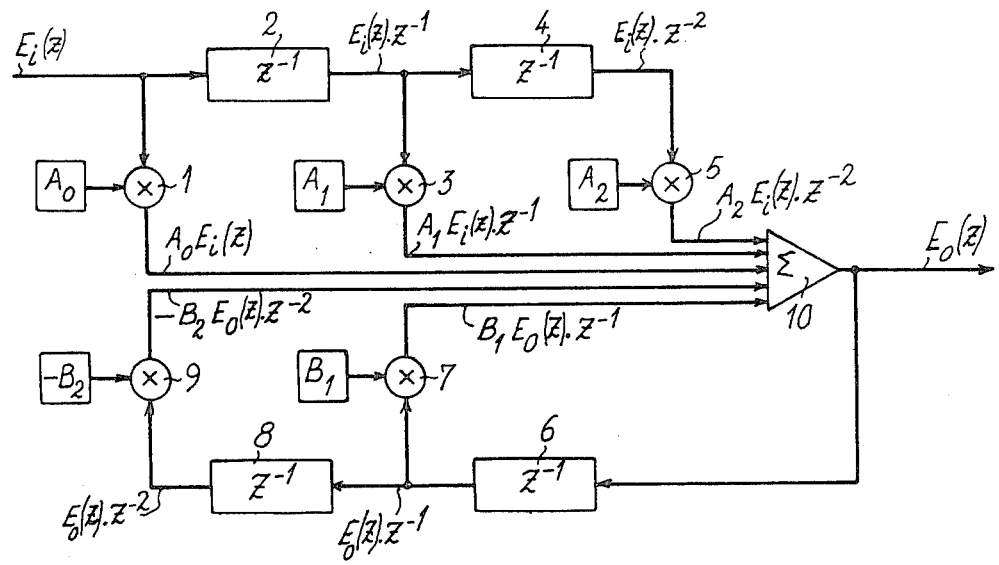
FIG. 1 is a theoretical direct structure diagram of a second order recursive digital filter already commented on in the introductory part.

According to a preferred embodiment based on the direct parallel structure in FIG. 1, a Butterworth type second order low-pass recursive digital filter of the invention with coefficients formed by the sum of a small number of powers of two uses the recurrence relationship (21) with n=17. Equation (21) then becomes equation (21'):

$$2^{17}y_i = (2^{17}-2^{10})y_{i-1} - (2^{17}-2^{10}+2^2)y_{i-2}+x_i+2x_{i-1}+x_{i-2} \quad (21')$$

Figure 6:
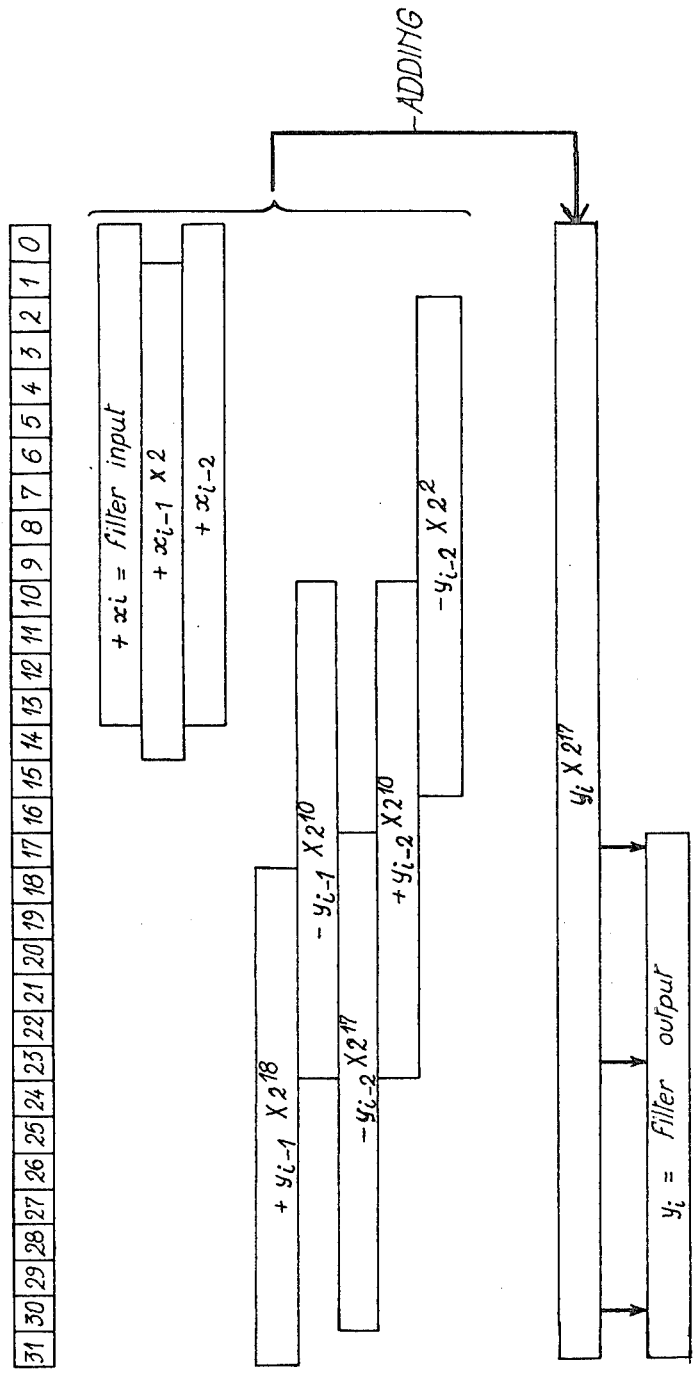
FIG. 6 explains the principle for calculating a filtered point in accordance with the invention for $n = 17$ for a direct structure.

FIG. 6 shows the principle underlying the calculation of a filtered point. The values of $x_i$, $x_{i-1}$, $x_{i-2}$, $y_{i-1}$ and $y_{i-2}$ are stored in 5 different memories and it is a question of summing:

$x_i$ (filter input)

with $x_{i-1}$ shifted towards the left by 1 bit with $x_{i-2}$ not shifted with $y_{i-1}$ shifted by 18 bits towards the left with $y_{i-1}$ shifted by 10 bits towards the left and the sign changed with $y_{i-2}$ shifted by 17 bits towards the left and the sign changed with $y_{i-2}$ shifted by 10 bits towards the left with $y_{i-2}$ shifted by 2 bits towards th left and the sign changed.

The sum of these 8 quantities is equal to the value of $y_i$ shifted by 17 bits towards the left. This value $y_i$ is the value of the filtered point leaving the filter.

Figure 7:
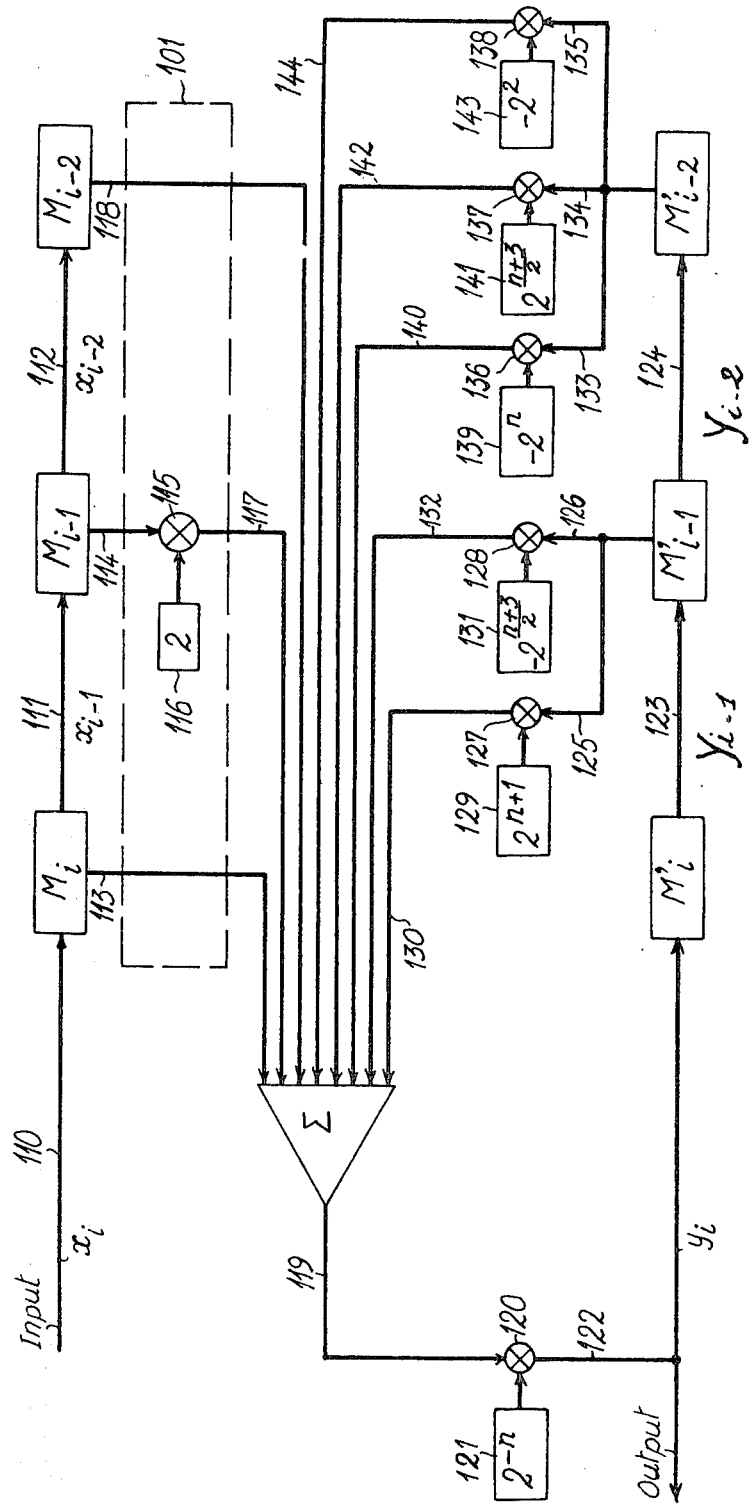
FIG. 7 shows a design schematic for a low-pass second order filter with coefficients formed by the sum of a small number of powers of two according to the direct structure.

FIG. 7 shows the scheme of one of the embodiments possible with this low-pass recursive filter of the invention. The digitized sample $x_i$ of the input signal sampled at the sampling frequency $f_e=1/\Delta t$ enters by line 110 and is stored in memory $M_i$. The preceding contents of memory $M_i$ are transferred via line 111 to memory $M_{i-1}$ and the preceding contents of memory $M_{i-1}$ are transferred via line 112 to memory $M_{i-2}$ in such a way that, at the instant $i\Delta t$, the three memories $M_i$, $M_{i-1}$ and $M_{i-2}$ contain the digitized samples $x_i$, $x_{i-1}$ and $x_{i-2}$ of the input signal respectively. The sample $x_i$ is transmitted via line 113 from memory $M_i$ to an adder $\Sigma$. The sample $x_{i-1}$ is transmitted via line 114 from memory $M_{i-1}$ to a multiplier 115 which is itself connected to a coefficient register 116 containing the coefficient value 2. The multiplier 115 is linked to the adder $\Sigma$ via line 117. The sample $x_{i-2}$ is transmitted via line 118 to the adder $\Sigma$. The output of the adder $\Sigma$ is linked via line 119 to a multiplier 120 connected to a coefficient register 121 containing the coefficient value $2^{-n}=2^{-17}$. The multiplier 120 is linked via line 122 to the output of the filter, on the one hand, and to a memory $M_i'$ on the other hand, which stores the output value $y_i$ of the filter. The shifts of the contents of memory $M_i'$ towards memory $M_{i-1}'$ and of the contents of memory $M_{i-1}'$ to memory $M_{i-2}'$ are carried out via lines 123 and 124 respectively. In this way, the stack of the three memories $M_i'$, $M_{i-1}'$ and $M_{i-2}'$ respectively contains, at the instant $i\Delta t$, the three values $y_i$, $y_{i-1}$ and $y_{i-2}$. Memory $M_{i-1}'$ is linked via lines 125 and 126 to two multipliers 127 and 128 respectively. Multiplier 127 is connected to a coefficient register 129 containing the coefficient value $2^{n+1}=2^{18}$ and is linked to the adder $\Sigma$ via line 130. Multiplier 128 is connected to a coefficient register 131 containing the coefficient value $-2^{(n+3/2)}=-2^{10}$ and is linked to the adder $\Sigma$ via line 132. Similarly, memory $M_{i-2}'$ is linked via lines 133, 134 and 135 to three multipliers 136, 137 and 138 respectively. Multiplier 136 is connected to a coefficient register 139 containing the coefficient value $-2^n=-2^{17}$ and is linked via line 140 to the adder $\Sigma$. Multiplier 137 is connected to a coefficient register 141 containing the coefficient value $2^{(n+3)/2}=2^{10}$ and is linked via line 142 to the adder $\Sigma$. The third multiplier 138 is connected to a coefficient register 143 containing the coefficient value $-2^2$ and is linked via line 144 to the adder $\Sigma$. The schematic in FIG. 7 that we have just described involves the calculation of recurrence formula (21). The seven multipliers 115, 120, 127, 128, 136, 137 and 138, each associated with its coefficient register, can be shift registers when suitably wired by taking into account, if it is desired to multiply the contents of a memory by a negative coefficient, that we have only to multiply the complement of the memory contents by the absolute value of the coefficient and then to add one to the result.

In another preferred embodiment of the same filter, the multipliers and their associated coefficient registers are replaced by a suitable bus line system for transferring data contained in the memories $M_i$, $M_{i-1}$, $M_{i-2}$, $M_{i-1}'$ and $M_{i-2}'$, to the adder. This latter preferred embodiment eliminates the need for multipliers and reduces the time for calculating the filtered signal. This embodiment, using transfer "bus" line 201 is described in FIG. 8 for the particular case of n=17.

The digitized samples $x_i$, $x_{i-1}$ and $x_{i-2}$ of the input signal corresponding to the times $i\Delta t$, $(i-1)\Delta t$ and $(i-2)\Delta t$ are stored in a stack of three registers, 202, 203 and 204 of 16 bits each. For each sampling period $\Delta t$, the stack of x's shifts by one word, i.e. $x_i$ takes the place of $x_{i-1}$, $x_{i-1}$ that of $x_{i-2}$. Register 202 is linked to data transfer "bus" line 201 via line 213 which connects the 16 bit positions of register 202 with no shift to the "bus" line. Line 214 connects the 16 bit positions of register 203 to the "bus" line 201 with a shift of one bit to the left and line 218 connects the 16 bit positions of register 204 to the "bus" line 201 with no shift.

The samples $2^{17}y_i$, $2^{17}y_{i-1}$ and $2^{17}y_{i-2}$ corresponding to the filtered values $y_i$, $y_{i-1}$ and $y_{i-2}$ at times $\Delta t$, $(i-1)\Delta t$ and $(i-2)\Delta t$ respectively are stored in a stack of three registers, 205, 206 and 207 of 32 bits each. As for the stack of registers 202, 203 and 204 containing the digitized samples of the input signal, the samples in registers 205, 206 and 207 shift from one to the following register at each sampling period. The output value of the filter, $y_i$, is given by the bits in bit positions 17 to 31 in register 205. To achieve the transition from the value $2^n y_{i-1}$ to $2^{n+1} y_{i-1}$, line 225 connects the 32 bit positions in register 206 to the "bus" line 201 with a shift of 1 bit to the left. To achieve the transition from $2^n y_{i-1}$ to $2^{(n+3)/2} y_{i-1}$, which amounts to shifting the contents of register 206 by 7 bits to the right, line 226 connects the bit positions 7 to 31 in register 206 to the "bus" line. Similarly to achieve the transition from $2^n y_{i-2}$ to the values $2^{(n+3)/2} y_{i-2}$ and $2^2 y_{i-2}$, lines 234 and 235 connect the bit positions 7 to 31 and 15 to 31 respectively in register 207 to the "bus" line. Line 233 connects the 32 bit positions in register 207 to the "bus" line with no shift. The output of the "bus" line is plugged in to the input of an adder-subtractor 208 equipped with a 32-bit accumulator register. The output of adder-subtractor 208 feeds the stack of 32-bit registers 205, 206 and 207. A sequencer 209 makes it possible to transfer the various data contained in the registers to the "bus" line successively and to control the adder-subtractor 208 in terms of the sign of the coefficients. It is also possible to add a sampler and analog to digital converter 210 controlled by clock pulses, to the filtering module thus defined, enabling the sampling frequency $f_e$ to be varied. The cut-off frequency $f_c$ of the filter may therefore be adjusted to the desired value by selecting a suitable value of the sampling frequency $f_e$, as indicated by equation (23).

Figure 8:
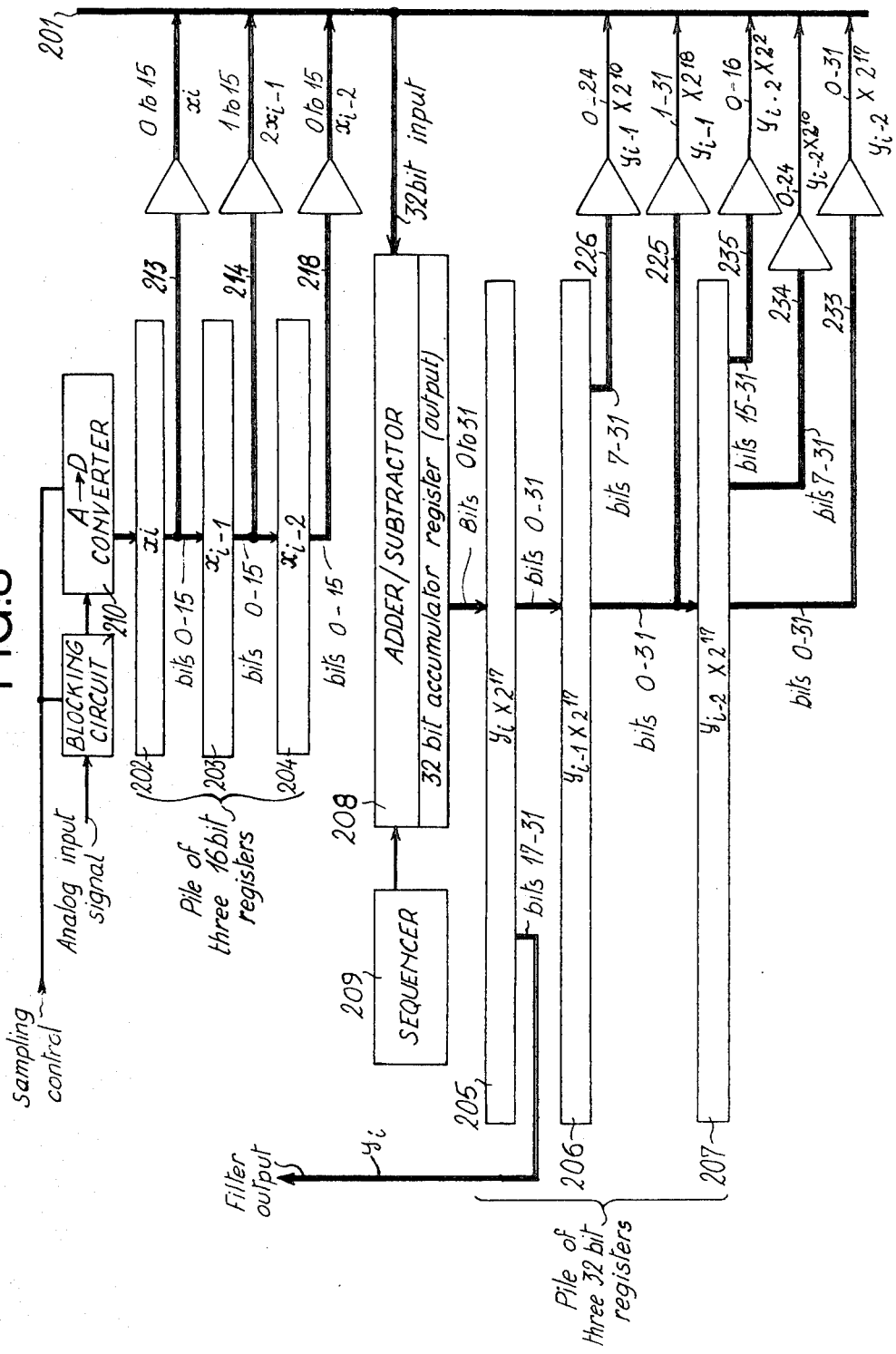
FIG. 8 shows a design schematic wired to a data transfer bus line when $n = 17$, for a direct structure.

The advantage of the arrangement described in FIG. 8 lies in the fact that the shifts in the connections of the various registers to the transfer bus line 201 are wired up once and for all and that the multiplications they perform require no calculation time. The time to calculate a filtered point corresponds, therefore, to that required to execute the 7 additions. All the components making up the arrangement in FIG. 8 are standard commercial ones, generally supplied in 4-bit sections. Performance-wise, adder-subtractors can be found on the market which perform an operation in 40 nanoseconds. The time to calculate a filtered point, in the light of the data transfer times using a transfer bus line, is therefore of the order of 500 nanoseconds. The cost price of such a module should be competitive compared to that of analog filters with low cut-off frequencies, paired in phase, that exist on the market.

We have studied the various embodiments of Butterworth type second order low-pass recursive digital filters of this invention with coefficients formed of a small number of powers of two, based on a direct structure. We can now put forward, in conjunction with FIGS. 9 to 12, some embodiments of high-pass and rejection filters of the invention, based on a direct structure, with coefficients formed of a small number of powers of two, which derive from the low-pass filter embodiments described above.

A design of a high-pass filter obeying the recurrence equation (28) or of a rejection filter obeying equation (32) is easily obtained from the low-pass filter designs of equation (21) by adequately modifying the section of the assembly which links the $x_i$, $x_{i-1}$ and $x_{i-2}$ memories to the adder. If we take the low-pass filter described in FIG. 7, we can obtain equivalent designs for high-pass or rejection filters by replacing the block 101 in FIG. 7 by blocks 101' or 101'' respectively in FIGS. 9 and 10. Blocks 101' and 101'' differ in the following way from block 101. A multiplier 1131 linked to a coefficient register 1132 containing the value $2^n$ is inserted on line 113. A multiplier 1181 linked to a coefficient register 1182 containing the value $2^n$ is inserted on line 118. Line 114 leads to multiplier 1151 which is linked to the adder $\Sigma$ by line 1171. This multiplier 1151 is connected to a coefficient register 1161 which contains the value $(-2^{n+1})$. Finally, in block 101'' corresponding to the rejection filter assembly, line 114 is, furthermore, connected to a multiplier 1152 via line 1142. Multiplier 1152 is linked to the adder $\Sigma$ by line 1172 and is connected to coefficient register 1162 which contains the value $2^2$.

An embodiment common to the three low-pass, high-pass and rejection filters and which exploits the generalized recurrence relationship (33), can also be achieved. FIG. 11 shows block 101''' which must replace block 101 in FIG. 7 to obtain a filter switchable to any one of three low-pass, high-pass and rejection positions. A function selector S includes three coefficient registers with respective contents of a, b and c being able to take the three values (a b c)=(100) or (010) or (011). This function selector S is connected to the input lines 113, 114 and 118 coming from the memories $M_i$, $M_{i-1}$ and $M_{i-2}$ respectively. The 7 lines 1133, 1134, 117, 1171, 1172, 1183 and 1184 are connected to the adder $\Sigma$ in FIG. 7. Block 101''' is equivalent to block 101 for (a b c)=(100) in the function selector S; for (a b c)=(010), it is equivalent to block 101' in FIG. 9 and for (a b c)=(011), to block 101'' in FIG. 10.

We have described starting from the preferred embodiment of the low-pass filter of FIG. 7, how we can develop a high-pass filter, a rejection filter and a filter switchable to the three low-pass, high-pass and rejection functions. We can apply the same parametrization methods to the preferred embodiment of FIG. 8 of the low-pass filter wired to a data transfer bus line. It is not our intention to explain these further modifications which any specialist is capable of applying on the basis of the foregoing.

An embodiment common to the three low-pass, high-pass and rejection filters, and which uses the generalized recurrence relationship (33'), may be achieved with a function selector S' including two coefficient registers with respective contents of d and e. The coefficients d and e can assume the three values (1,0), (−1,0) and (−1,1). FIG. 12 shows block $101^{IV}$ which must replace block 101 in FIG. 7 in order to create such a filter switchable over to the three low-pass, high-pass and rejection positions. Block $101^{IV}$ in FIG. 12 differs from block 101 in FIG. 7 in the following way: a multiplier 1131 linked to coefficient register 1132 containing the value $2^q$ is inserted on line 113. A multiplier 1181 linked to a coefficient register 1182 containing the value $2^q$ is inserted on line 118. Line 114 terminates at the function selector S' which contains two multipliers 190 and 191 linked to two coefficient registers 192 and 193 containing the values d and e respectively. Multiplier 190 connects, via line 1141, line 114 to multiplier 1151. Multiplier 1151 is linked to the coefficient register 1161 containing the value $2^{q+1}$ and is connected to the adder $\Sigma$ by line 1171. Multiplier 191 connects, via line 1142, line 114 to multiplier 1152. Multiplier 1152 is linked to the coefficient register 1162 containing the value $2^{q-n+2}$ and is connected to the adder Σ by line 1172. The value of the integer q is selected in terms of the desired gain, the gains being able to assume only discrete values equal to powers of two. The selection of the integer q can also be made by the function selector S′. To obtain gains equal to unity, the function selector S′ must select the value q=0 when the pair of coefficients (d,e) takes the value (1,0) and must select q=n when (d,e) takes the values (−1,0) and (−1,1). The fact that the value of q must be selected in conjunction with the value of the pair of coefficients (d,e) by the function selector S′ removes the possibility of transposing the transformation method, in which block $101^{IV}$ in FIG. 12 replaces block 101 in FIG. 7, to a wired system such as that shown in FIG. 8.

Figure 13:
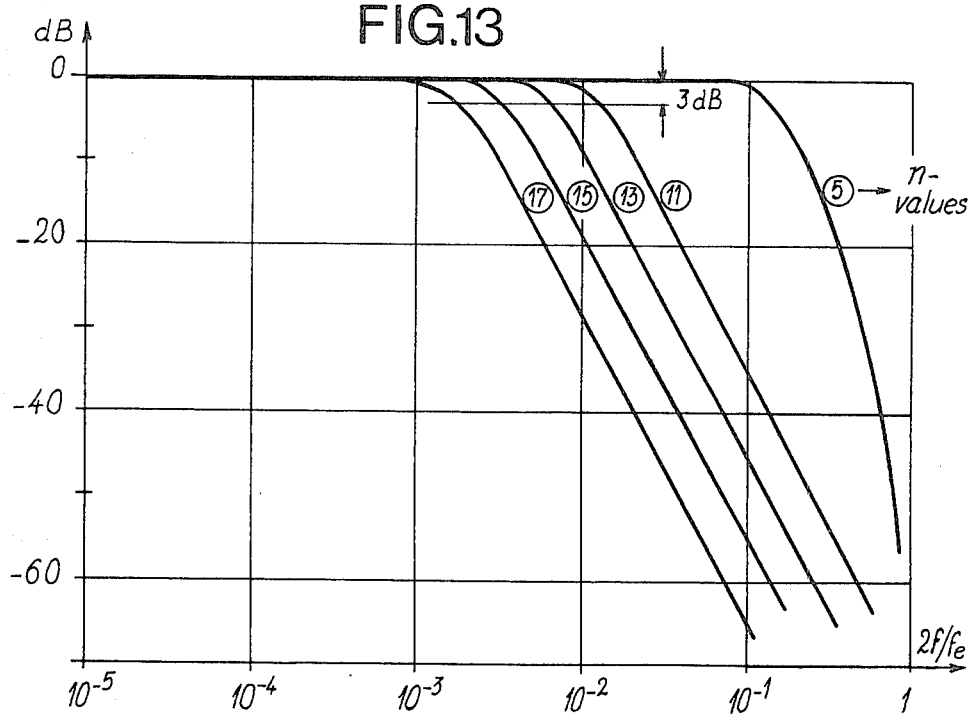
FIGS. 13 and 14 present the amplitude and phase response curves of the Butterworth low-pass filter of the invention with coefficients formed by the sum of a small number of powers of two, for n=5, 11, 13, 15 and 17.
Figure 14:
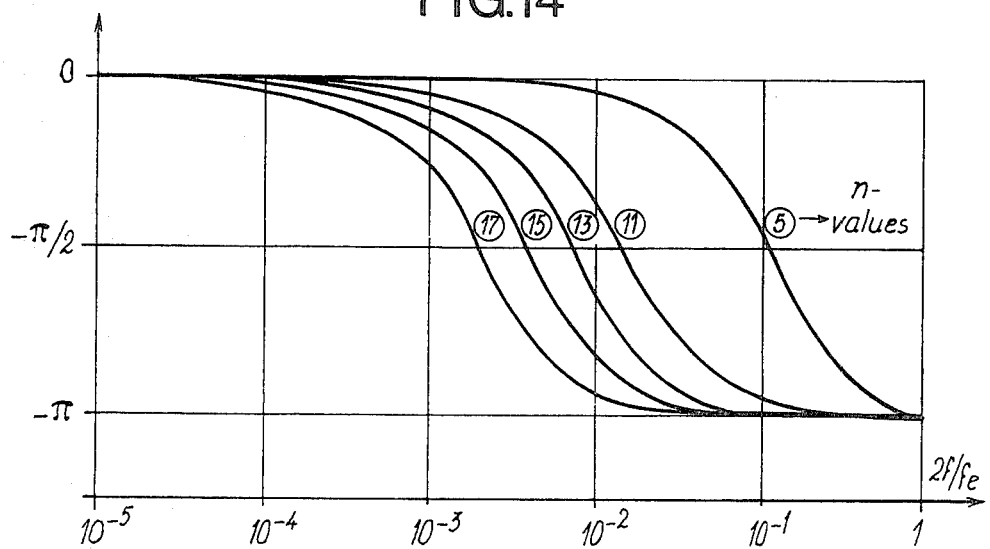

FIGS. 13 and 14 show the attenuation and phase response curves of the Butterworth type second order low-pass recursive digital filter of the invention, with coefficients formed by the sum of a small number of powers of two for various values of the odd integer n. It will be noted, with the exception of the curves obtained for n=5, that the form of the curves corresponding to n=11, 13, 15 and 17 is entirely identical to those of conventional Butterworth filters. The shortcoming noted for n=5 stems from the fact that, for n too small, the condition $\alpha=\omega_c\Delta t \leq 1$ is no longer respected and that the relationship (12′) is no longer valid. The frequency deformation of formula (12′) due to the conformal transform (2) then becomes apparent. However, the case of n=5 is of practically no interest since the advantage of the low-pass filter of the invention lies essentially in its low cut-off frequency. Table VI below gives the value of the damping factor η and the digital cut-off frequency $f_c'$ of the low-pass filter in the invention for the values n=11, 13, 15, 17 and 19.

TABLE VI

| n | η | $f_c/f_e$ | $f_c$ in Hz for $f_e = 10^3$ Hz |
|---|---|---|---|
| 11 | 0.696 | 7.13 $10^{-3}$ | 7.13 |
| 13 | 0.701 | 3.63 $10^{-3}$ | 3.63 |
| 15 | 0.704 | 1.77 $10^{-3}$ | 1.77 |
| 17 | 0.706 | 0.88 $10^{-3}$ | 0.88 |
| 19 | 0.7065 | 0.44 $10^{-3}$ | 0.44 |

It should be noted that the damping factor η calculated by the exact equation (18) is very close to the theoretical value of $1/\sqrt{2} \approx 0.7071$ for a Butterworth filter. The last column in the above table indicates the value of the digital cut-off frequency $f_c'$ for a sampling frequency of 1000 Hz. It can be seen that $f_c'$ decreases by roughly half when n passes to n+2. This is due to the fact that the coefficient $A_o$ approximates to $\alpha^2$ when n is large.

Figure 15:
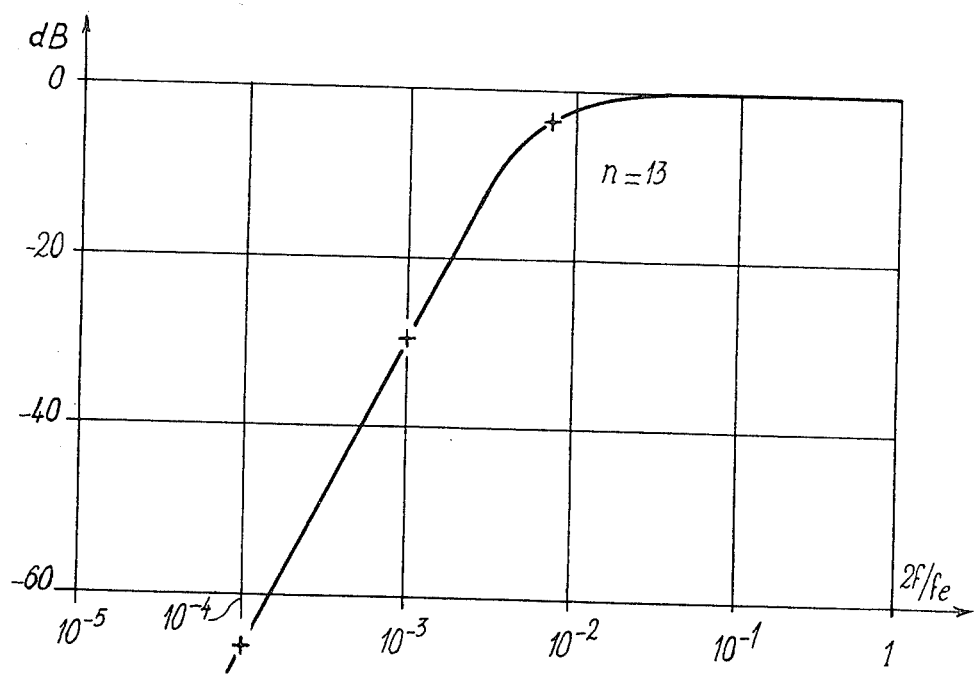
FIGS. 15 and 16 show the amplitude response curves of the high-pass and rejection filters of the invention for n=13.
Figure 16:
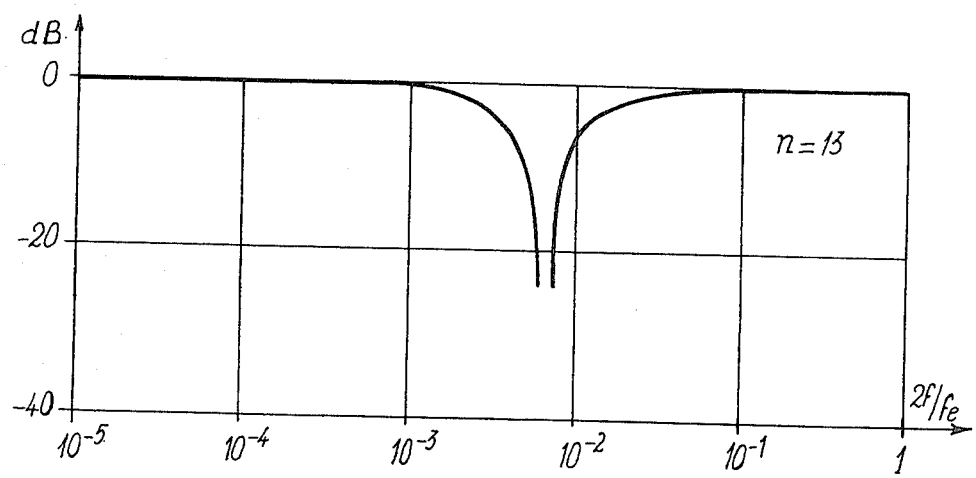

FIGS. 15 and 16 give the attenuation response curves for the high-pass and rejection digital filters of the invention respectively, for n=13.

The design methods which have just been described are not only applicable to the synthesis of Butterworth type second order low-pass recursive digital filters and to the extension to high-pass and rejection filters. It is possible to apply these methods to the synthesis of filters of different characteristics, such as those of Bessel or Legendre, for instance.

As an example, we are now going to describe how to synthesize filters of any order from the transfer function in p of a first order low-pass filter. This example leads to some particularly simple designs.

The transfer function of a first order low-pass filter is expressed by:

$$H(p) = (1)/1 + p/\omega_c \tag{38}$$

and, by applying the conformal transform (2), the z-transform is given by:

$$H(z) = C \frac{1 + z^{-1}}{1 - D z^{-1}} \tag{39}$$

where $C=(\alpha)/\alpha+1$ and $D=1-2C$. For $\alpha=\omega_c\Delta t$ small, C is put equal to $2^{-n}$ where n is large and the recurrence relationship is written:

$$2^n y_i = (2^n - 2) y_{i-1} + x_i + x_{i-1} \tag{40}$$

The angular cut-off frequency is given by $$\omega_c = (f_e)/(2^n - 1) \simeq 2^{-n} f_e \tag{41}$$

The first order low-pass filter with coefficients formed by the sum of a small number of powers of two thus constructed is particularly simple because it only requires 3 additions over and above the shifts which effect the multiplications and also because it can be built with wiring. Placing two first order units in series gives a second order filter whose damping factor η is equal to unity. As regards speed of calculation, the filter formed by placing two first order units in series is a little faster than the second order Butterworth filter of the invention described throughout, as it necessitates only 6 additions instead of 7.

Starting from the first order low-pass filter complying with recurrence relationship (40) as in the case of a second order filter described above, a high-pass filter can be constructed whose recurrence relationship is:

$$2^n y_i = (2^n - 2) y_{i-1} + 2^n x_i - 2^n x_{i-1} \tag{42}$$

The method of synthesizing the recursive digital filters of the invention with coefficients formed by the sum of a small number of powers of two is thus very general.

The foregoing filters are second order recursive digital ones of the Butterworth type, with damping factors η equal to $1/\sqrt{2}$ and coefficients formed by the sum of a small number of powers of two, which are based on a direct structure and mounted in parallel. The filters described up to this stage also cover first order recursive digital ones with coefficients formed by the sum of a small number of powers of two, based on the same structure. All these filters perform the multiplications by the recurrence relationship coefficients, expressed in the form of a sum of a small number of powers of two, either by using shift register type multipliers connected to coefficient registers containing the powers of two in question, or via a wiring system on a data transfer bus line.

Figure 2:
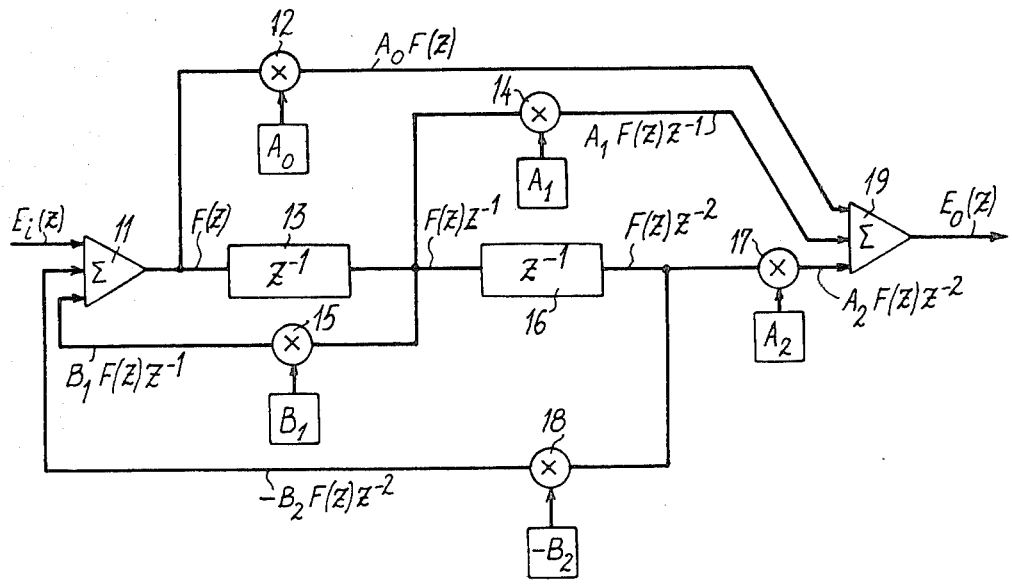
FIG. 2 is a theoretical canonic structure diagram of a second order recursive digital filter already commented on in the introductory part.
Figure 3A:
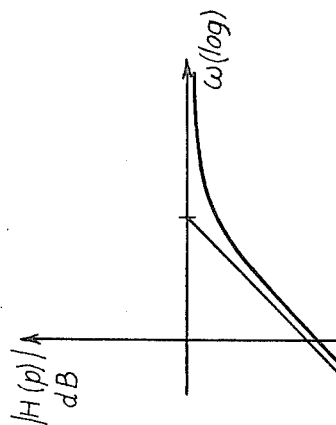
FIGS. 3A, 3B and 3C present the synthesis of a high-pass filter derived from a Butterworth low-pass filter and a filter with a transfer function given by $p^2/\omega_c^2$; these figures have been commented on the introductory part.
Figure 3B:
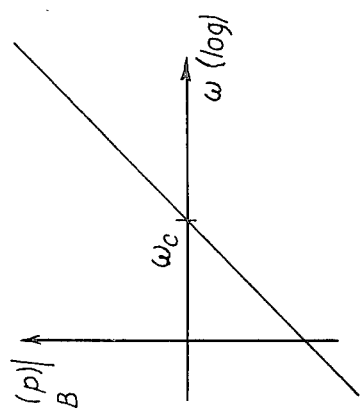
Figure 3C:
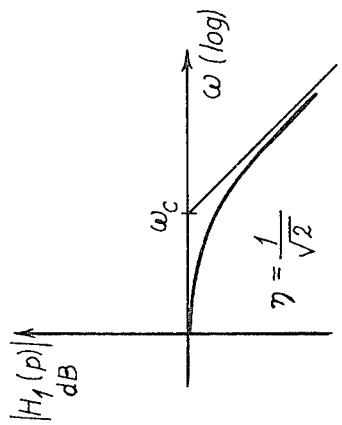
Figure 4:
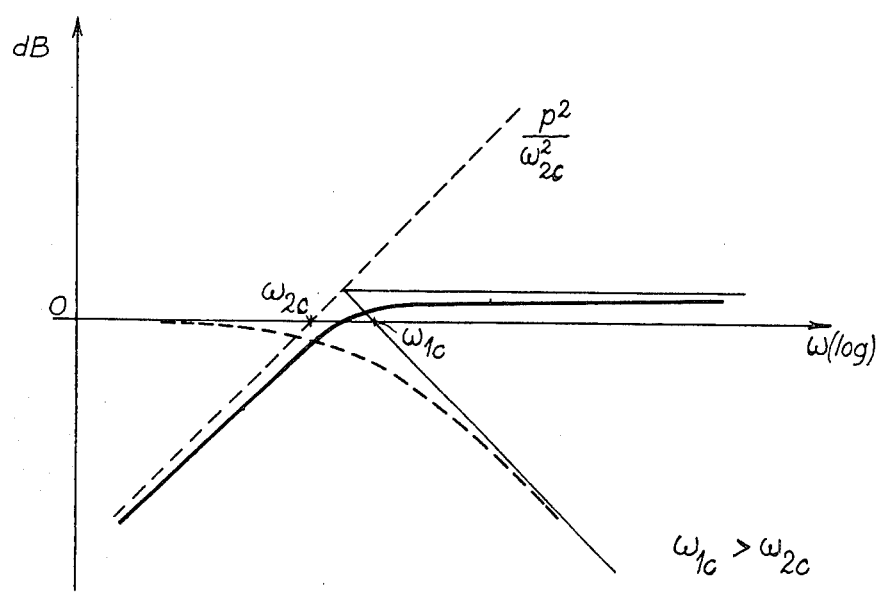
FIG. 4 presents the attenuation characteristic of the high-pass filter synthetized in FIG. 3 when the cut-off frequencies $\omega_{1c}$ and $\omega_{2c}$ are slightly different; it has been commented on in the introductory part.
Figure 5A:
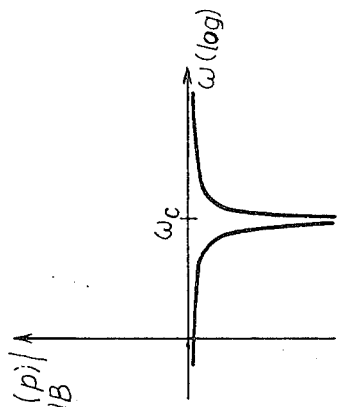
FIGS. 5A, 5B and 5C present the synthesis of a rejection filter derived from a Butterworth low-pass filter and a filter with a transfer function given by $1 + p^2/\omega_c^2$; they have been commented on in the introductory part.
Figure 5B:
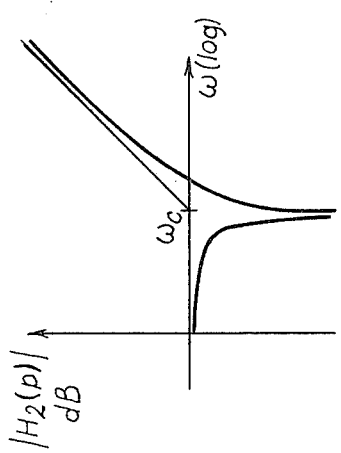
Figure 5C:
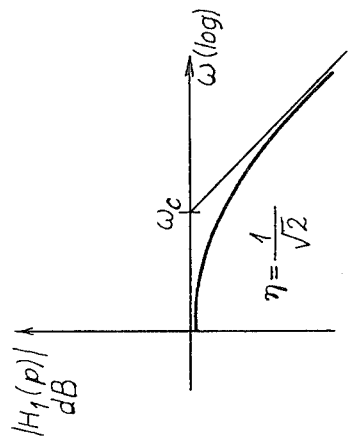

The second order recursive digital filters according to the invention that we are now going to describe have the recurrence relationship coefficients appearing in table V and are built according to the theoretical canonic structure diagram in FIG. 2 and mounted in series.

These filters, with canonic structures, about to be described have a lower cost price than the direct structure type since they require fewer components, whilst still being capable of delivering a filtered signal with the same characteristics. However, they offer lower calculating speeds and would be preferable to the preceding embodiments if the reduction in the cost price overrides the loss in speed.

Figure 17:
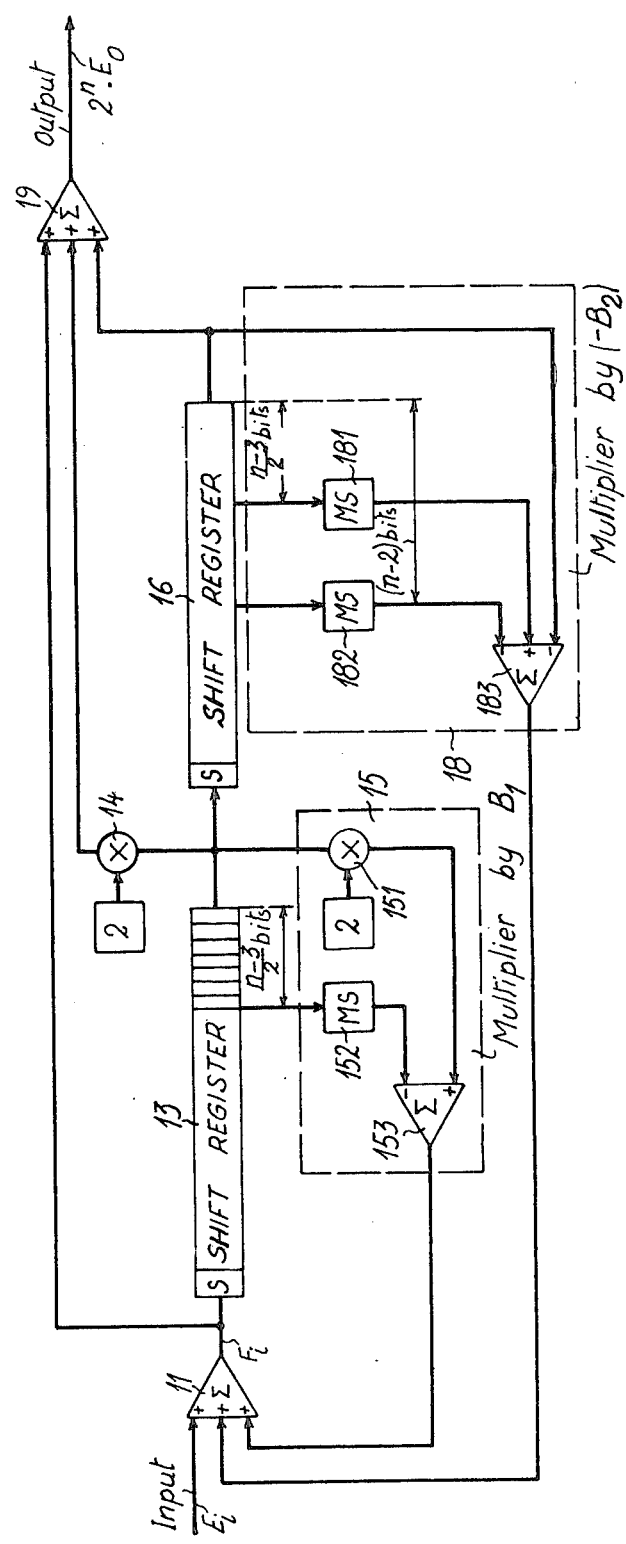
FIG. 17 represents a second order recursive digital filter of the invention, with coefficients formed by the sum of small number of powers of two, a series-mounted canonic structure and of the Butterworth low-pass type.

FIG. 17 shows a Butterworth low-pass filter for which $\eta = 1/\sqrt{2}$, i.e. $k = -1$ and the pair $(\epsilon_1, \epsilon_2)$ is chosen equal to (0.4). The z-transform of such a filter is given by:

$$H(z) = \frac{2^{-n}(1 + 2z^{-1} + z^{-2})}{1 - (2 - 2^{\frac{3-n}{2}})z^{-1} + (1 - 2^{\frac{3-n}{2}} + 2^{2-n})z^{-2}} \quad (43)$$

and the recurrence relationships (10) and (11) are rewritten as:

$$2^n E_o = F_i + 2F_{i-1} + F_{i-2} \quad (44)$$
$$F_i = \quad (45)$$
$$E + (2 - 2^{\frac{3-n}{2}})F_{i-1} + (-1 + 2^{\frac{3-n}{2}} - 2^{2-n})F_{i-2}$$

where $F_i$, $F_{i-1}$ and $F_{i-2}$ are the digitalized values at moments $i\Delta t$, $(i-1)\Delta t$ and $(i-2)\Delta t$ of the intermediate signal delivered by the input adder. In FIG. 17, the input signal $E_i$ is applied to one of the inputs of input adder 11 whose output is linked to the input of shift register 13 and to an input of output adder 19. The output of output adder 19 delivers the output signal $2^n E_o$. If we wish to obtain the filtered signal $E_o$, a $2^{-n}$ multiplier (not shown on the drawing) must be placed at the output of the output adder. A first output of shift register 13 is linked to the input of shift register 16 and to two multiplying units 14 and 15. Multiplying unit 14 is a multiplier associated with a coefficient register containing the value 2 and its output is linked to one of the inputs of output adder 19. A second output of shift register 13 shifted by $(n-3)/2$ bits with respect to the first is also linked to multiplying unit 15, the output of this unit 15 being linked to one of the inputs of input adder 11. A first output of shift register 16 is linked to an input of output adder 19 and to multiplying unit 18. Two other outputs of shift register 16 shifted by $(n-3)/2$ and $(n-2)$ bits respectively in relation to the first output are also connected to multiplying unit 18. The output of multiplying 18 is linked to one of the inputs of input adder 11. The multiplying units 15 and 18 serve to multiply by the coefficients $B_1 = 2 - 2^{(3-n)/2}$ and $(-B_2) = -1 + 2^{(3-n)/2} - 2^{(2-n)}$ and will be described in detail. Multiplying unit 15 includes a multiplier 151 associated with a coefficient register containing the value 2, a sign memorizer 152 and a series adder 153. The multiplier 151, being connected to the first output of shift register 13, performs the multiplication of the signal $F_{i-1}$ by 2. The sign memorizer 152 receives the second output of shift register 13 which is shifted by $(n-3)/2$ bits to the left with respect to the first output and therefore delivers the signal $2^{(3-n)/2}F_{i-1}$. The sign memorizer 152 is mounted in series on the shifted output of shift register 13 and is used for memorizing the sign of the information contained in this register at the moment when this sign arrives at the shifted output. For the whole sequence of bit shifts, it is this memorized sign which is transmitted to the input of series adder 153, thus enabling the sign extension problem to be resolved. The output of multiplier unit 15 delivers the signal $(2 - 2^{(3-n)/2})F_{i-1}$ and has thereby performed the multiplication of $F_{i-1}$ by $B_1$. In a similar fashion, multiplying unit 18 includes two sign memorizers 181 and 182 and a series adder 183. The sign memorizers 181 and 182 are mounted in series on the two shifted outputs of shift register 16 respectively and are used to memorize the sign of the information contained in the register at the moment when this sign arrives at each shifted output respectively. Series adder 183 receives the signals $F_{i-2}$, $2^{(3-n)/2}F_{i-2}$ and $2^{(2-n)}F_{i-2}$ and its three inputs respectively and delivers the signal $(-1 + 2^{(3-n)/2} - 2^{(2-n)})F_{i-2}$ and has thereby performed the multiplication by $(-B_2)$. The series adders 153 and 183 can, quite obviously, be comprised in the input adder which will thus comprise 6 inputs. Each of the two multipliers 14 and 151 associated with a coefficient register containing the value 2 may be a simple "flip-flop" set initially at zero and mounted in series between the output of shift register 13 and the input of the corresponding series adder, 19 and 153 respectively. The design in FIG. 17 performs the recurrence relationship (44) in output adder 19 and the recurrence relationship (45) in input adder 11.

Figure 18:
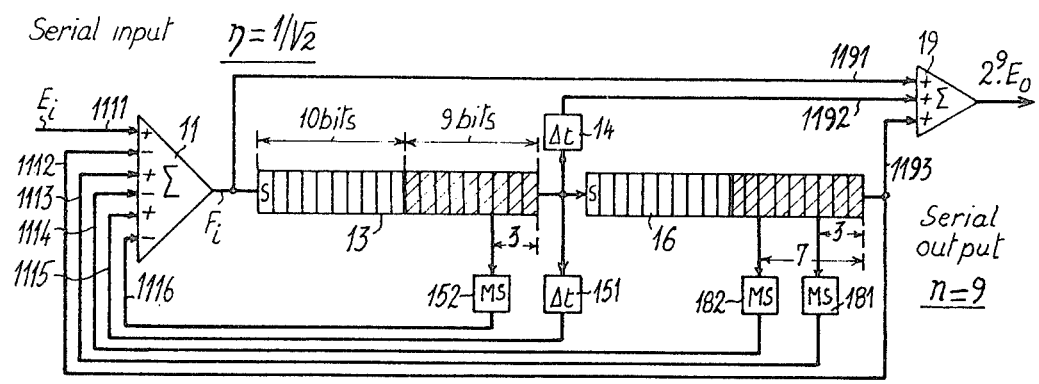
FIGS. 18 to 22 represent low-pass filters of the invention with canonic structures for various values for the damping factor $\eta$ and a value for n equal to 9 or 10.

FIG. 18 shows a particular embodiment of the Butterworth low-pass second order recursive digital filter in FIG. 17 for which the series adders 153 and 183 of the multiplier units 15 and 18 are incorporated in input adder 11. In FIG. 18, it has been assumed that $n = 9$ and that the input signal is coded over 10 bits. In this case $B_1 = 2 - 2^{-3}$ and $(-B_2) = -1 + 2^{-3} - 2^{-7}$.

The same components in FIGS. 17 and 18 carry the same reference numbers. The shifted output of shift register 13 is shifted by 3 bits towards the left and delivers the signal $2^{-3} F_{i-1}$. The shifted outputs of shift register 16 are shifted by 3 and 7 bits towards the left and deliver the signals $2^{-3} F_{i-2}$ and $2^{-7} F_{i-2}$ respectively. Input adder 11 receives at its six entries, 1111 to 1116, the signals $E_i$, $F_{i-2}$, $2^{-3} F_{i-2}$, $2^{-7} F_{i-2}$, $2 F_{i-1}$ and $2^{-3} F_{i-1}$ respectively and delivers the value $F_i$ at its output, in accordance with recurrence relationship (45) for $n = 9$. Output adder 19 receives the signals $F_i$, $2 F_{i-1}$ and $F_{i-2}$ at its three entries 1191, 1192 and 1193 and delivers the value $2^9 E_o$ at its output, in accordance with the recurrence relationship (44) for $n = 9$. The value $n = 9$ has been chosen to illustrate the design in FIG. 17 for simplicity's sake, so as not to overburden the diagram. The odd value of n is imposed by the parity condition on $n + 4 + k$ since, in the case of a Butterworth filter, the value of k is equal to $-1$. In practice, a larger value for n is generally desirable.

FIGS. 19 to 22 show embodiments of low-pass recursive digital filters of the invention for various values of the damping factor $\eta$, namely for $\eta = 0, \frac{1}{2}, 1/\sqrt{2}$ and 1, giving $k = -\infty, -2, -1$ and 0 respectively. In this case, the values of $B_1$ and $(-B_2)$ in terms of $\eta$ are given in table VII below:

TABLE VII

| $\eta$ | k | $B_1$ | $-B_2$ | n |
|---|---|---|---|---|
| 0 | $-\infty$ | $2 + \epsilon_1 2^{-n}$ | $-1 - \epsilon_2 2^{-n}$ | indifferent |
| 1/2 | $-2$ | $1 - 2^{\frac{2-n}{2}} + \epsilon_1 2^{-n}$ | $-1 + 2^{\frac{2-n}{2}} - \epsilon_2 2^{-n}$ | even |
| $1/\sqrt{2}$ | $-1$ | $2 - 2^{\frac{3-n}{2}} + \epsilon_1 2^{-n}$ | $-1 + 2^{\frac{3-n}{2}} - \epsilon_2 2^{-n}$ | odd |
| 1 | 0 | $2 - 2^{\frac{4-n}{2}} + \epsilon_1 2^{-n}$ | $-1 + 2^{\frac{4-n}{2}} - \epsilon_2 2^{-n}$ | even |

The parity of n must therefore, for these four cases, be indifferent, even, odd and even respectively and we take, to illustrate the point, the values n=9, 10, 9 and 10 respectively, for simplicity's sake.

Figure 19:
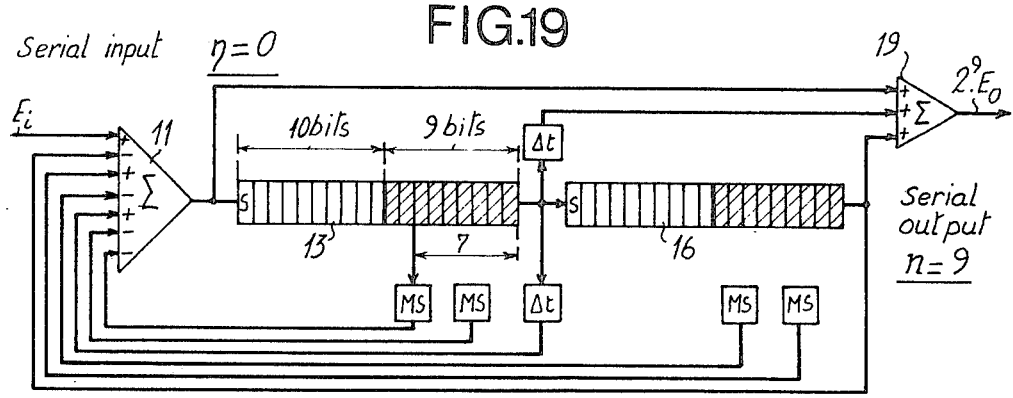

In FIG. 19, for $\eta=0$, n=9 and ($\epsilon_1$, $\epsilon_2$) chosen equal to $(-4,0)$, which corresponds exactly to $\epsilon_2 = 4\eta^2$, we find that:

$$B_1 = 2 - 2^{-7}$$

$$(-B_2) = -1$$

The values of these coefficients are represented by the connection of one output, shifted by 7 bits towards the left of shift register 13, to input adder 11.

Figure 20:
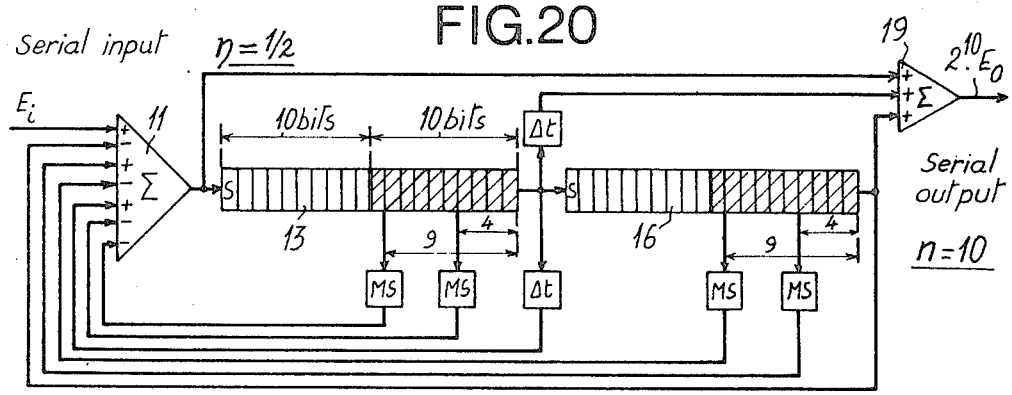

In FIG. 20, for $\eta=\frac{1}{2}$, n=10 and ($\epsilon_1$, $\epsilon_2$) chosen equal to $(-2, +2)$, we find that $$B_1 = 2 - 2^{-4} - 2^{-9}$$

$$(-B_2) = -1 + 2^{-4} - 2^{-9}$$

The values of these coefficients are represented by the connections of two outputs, shifted by 4 and 9 bits in both shift register 13 and 16, to input adder 11.

Figure 21:
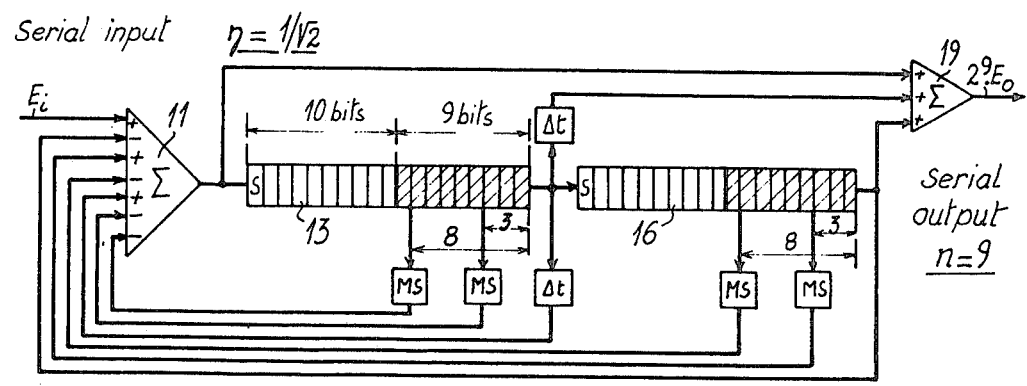

In FIG. 21, for $\eta=1/\sqrt{2}$, n=9 and ($\epsilon_1$, $\epsilon_2$) chosen equal to $(-2, +2)$, which corresponds exactly to $\epsilon_2 = 4\eta^2$, we find that:

$$B_1 = 2 - 2^{-3} - 2^{-8}$$

$$(-B_2) = -1 + 2^{-3} - 2^{-8}$$

The values of these coefficients are represented by the connections of two outputs, shifted by 3 and 8 bits in both shift register 13 and 16, to input adder 11.

Figure 22:
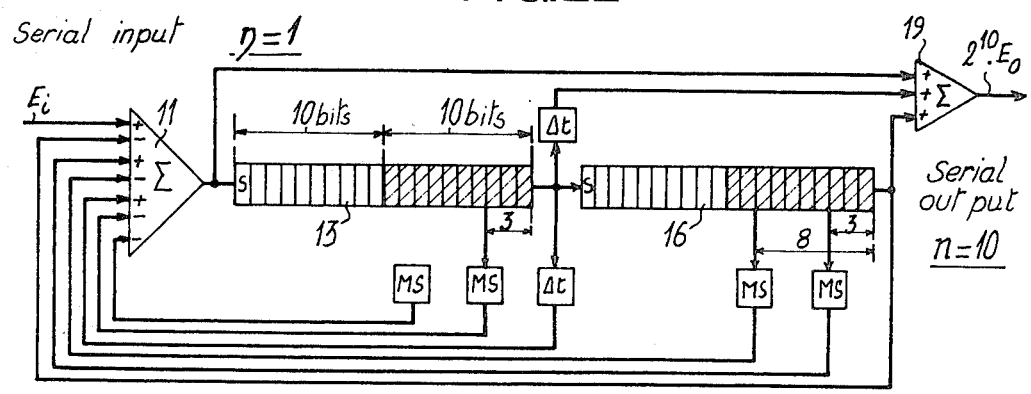

In FIG. 22, for $\eta=1$, n=10 and ($\epsilon_1$, $\epsilon_2$) chosen equal to $(0,4)$, which again corresponds to $\epsilon_2 = 4\eta^2$, we find that:

$$B_1 = 2 - 2^{-3}$$

$$(-B_2) = -1 + 2^{-3} - 2^{-8}$$

The values of these coefficients are represented by the connections of one output, shifted by 3 bits in shift register 13, and of two outputs, shifted by 3 and 8 bits in shift register 16, to input adder 11.

Figure 23:
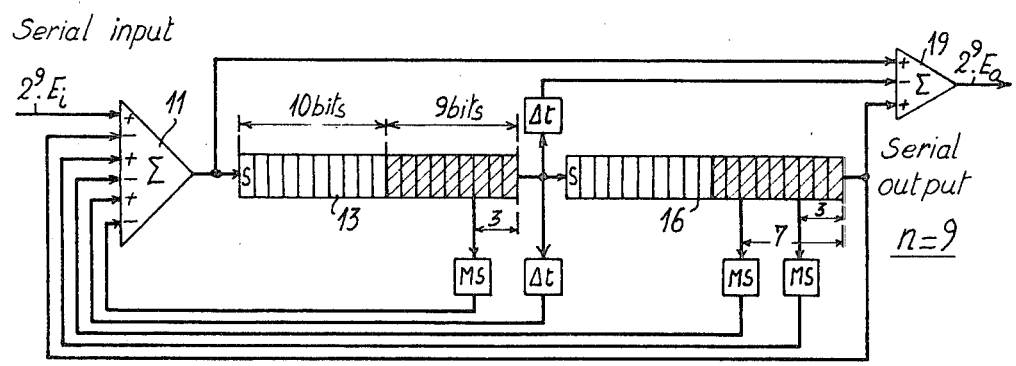
FIGS. 23 and 24 represent a high-pass and a rejection filter respectively, with canonic structures, according to the invention for a damping factor $\eta=1/\sqrt{2}$ and for n=9.
Figure 24:
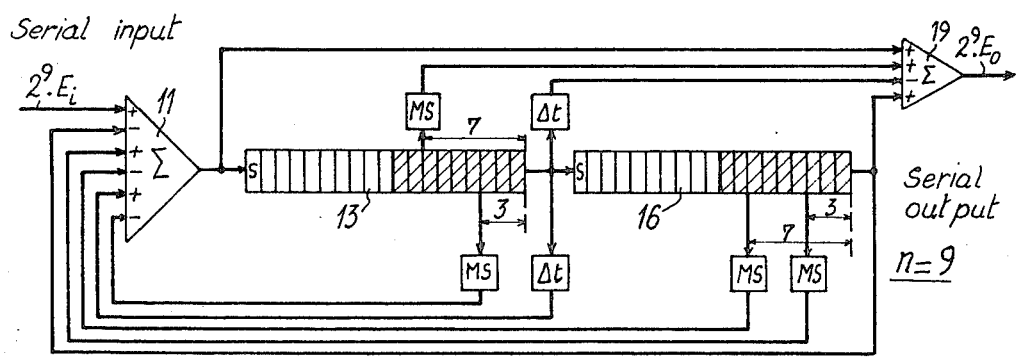

In FIGS. 23 and 24, we can see embodiments of high-pass and rejection recursive digital filters of the invention for a value of the damping coefficient $\eta$ equal to $1/\sqrt{2}$, i.e. $k=-1$. The value of n is chosen equal to 9 and the pair ($\epsilon_1$, $\epsilon_2$) equal to $(0,4)$ which minimizes the number of shifted outputs towards the input adder. All the outputs shifted or not, going from the shift registers to the input adder are thus connected in the same way as in the case of the low-pass filter of the Butterworth type in FIG. 17. On the other hand, the connections going from the shift registers to output adder 19 are no longer the same. For a high-pass filter, we should, in actual fact, have $$A_0 = A_2 = 2^n$$

$$A_1 = 2^n(-2)$$

and for a rejection filter $$A_0 = A_2 = 2^n$$

$$A_1 = 2^n(-2 + 2^{2-n})$$

In the high-pass and rejection filters in FIGS. 23 and 24, the filter input data is $2^n E_i$ and no longer $E_i$ as in the low-pass filters of FIGS. 17 to 22. For the high-pass filter in FIG. 23, the connection of the output from shift register 13 to output adder 19 is taken into account at the input of adder 19 with the minus sign. For the rejection filter in FIG. 24, an additional connection must be made which links an output, shifted by 7 bits towards the left of shift register 13, with output adder 19.

From all these design examples shown in FIGS. 18 to 24 and the values of the coefficients in table V, it can be seen that it is possible to build a filter structure which can combine all the second order recursive digital filters with coefficients given in table V.

Figure 25:
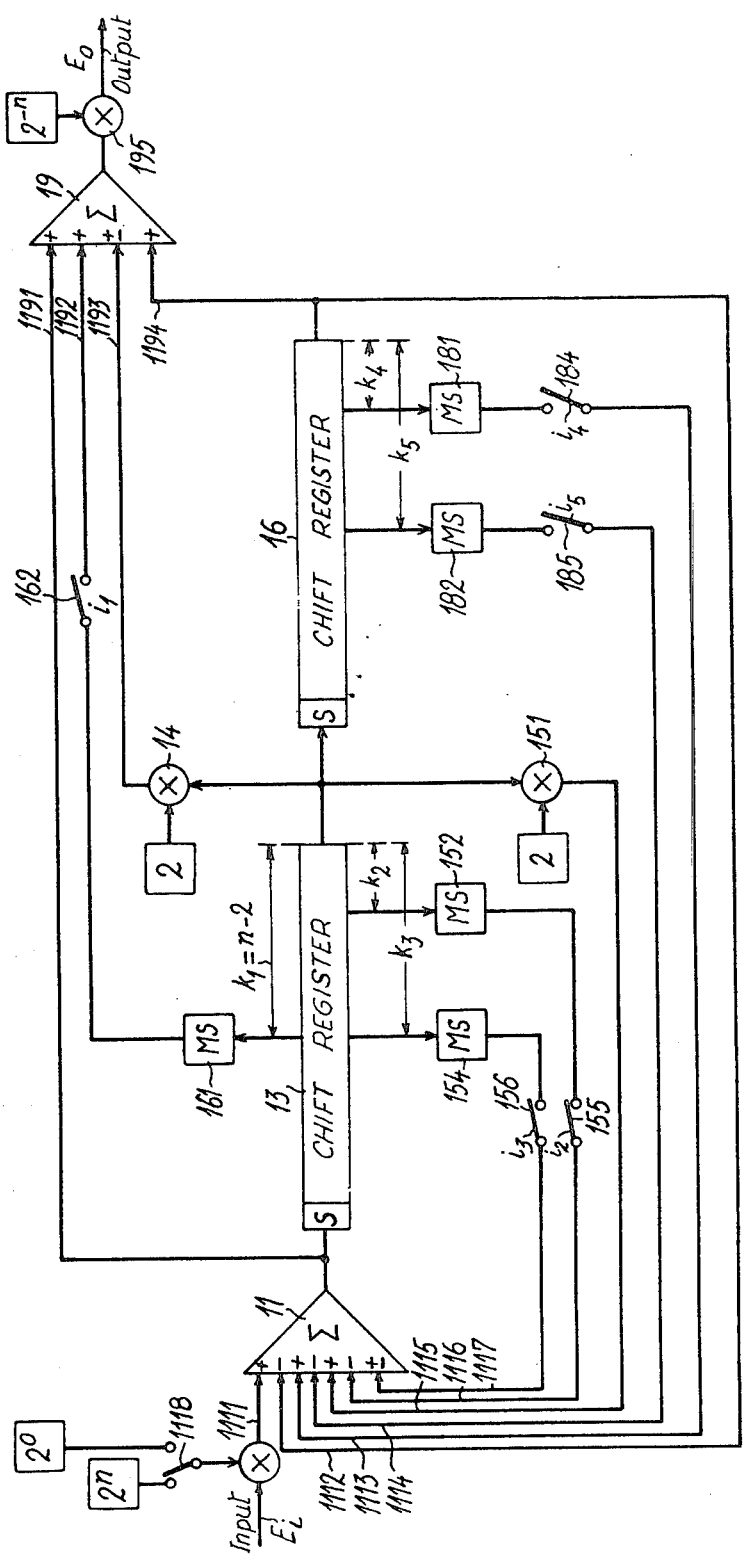
FIG. 25 represents a canonic structure filter according to the invention making it possible to select the type of filter, i.e. low-pass, high-pass or rejection, the damping factor $\eta$ and the approximations used for certain terms of the coefficients $B_1$ and $B_2$.

This universal second order filter structure of the invention, seen in FIG. 25, includes an input adder 11 with seven inputs and an output adder 19 with four inputs. The inputs 1111 to 1116 of input adder 11 have $+$, $-$, $+$, $-$, $+$ and $-$ inputs respectively. Input 1117 is either a $+$ or a $-$ input. A switch 1118 with two positions denoted by $2^0$ and $2^n$ is placed upstream of input 1111. In position $2^0$, the switch 1118 allows the input data $E_i$ to pass without being modified. In position $2^n$, this switch diverts the input data $E_i$ via a multiplier associated with a coefficient $2^n$, so that the input 1111 of input adder 11 receives the signal $2^n E_i$. The output of input adder 11 is linked to the input 1191 of output adder 19 and the input of shift register 13. A first output of shift register 13 is linked to a times-two multiplier 14, a times-two multiplier 151 and the input of shift register 16. The output of multiplier 14 is linked to the input 1193 of output adder 19, which is either a plus or a minus input. The output of multiplier 151 is linked to the plus input 1115 of input adder 11. The output of shift register 16 is linked to the plus input 1194 of output adder 19 and to the minus input 1112 of input adder 11. Three shift register 13 outputs shifted by $k_1$, $k_2$ and $k_3$ respectively are linked via the sign memorizers 161, 152 and 154 and the switches 162, 155 and 156 to the plus, minus and plus or minus inputs 1192, 1116 and 1117 respectively of the input and output adders.

Similarly, two shift register 16 outputs shifted by $k_4$ and $k_5$ are linked by means of sign memorizers 181 and 182 and switches 184 and 185 to the plus and minus inputs 1113 and 1114 respectively of input adder 11. The output of output adder 19 is linked to a multiplier 195 which multiplies the signal delivered by the adder 19 by $2^{-n}$. The output of multiplier 195 delivers the filtered signal $E_j$.

The values to be assigned to the shifts $k_1$ to $k_5$ of the shifted outputs of the shift registers as well as the positions of the switches $i_1$ to $i_5$, the position of the input switch 118 and the sign of the input 1117 of the input adder and of the input 1193 of the output adder are summarized in FIG. 26 for certain types of filters, certain values of the damping coefficient and for different values of the pair ($\epsilon_1$, $\epsilon_2$).

Generally speaking, the input switch 1118 is set to the $2^o$ position for low-pass filters and to $2^n$ for high-pass and rejection filters.

Also, in general, the sign of input 1193 of the output adder 19 is plus for low-pass filters and minus for high-pass and rejection ones.

Finally, switch 162, $i_1$, is usually open for high-pass and low-pass filters and closed for rejection filters, the value of $k_1$ always being equal to $n-2$.

To determine the values of the other parameters, the parameterization of $B_1$ and $(-B_2)$ must be taken into consideration:

$$B_1 = 2 - 2^{-k_2} \pm 2^{-k_5}$$

$$(-B_2) = -1 + 2^{-k_4} - 2^{-k_5}$$

By comparing these formulae with those in table V, the following relationships can be deduced:

$$k_2 = k_4 = (n-4-k)/2$$

$$\epsilon_1 = \pm 2^{n-k_3}$$

$$\epsilon_2 = 2^{n-k_5}$$

which make it possible to use the universal filter structure of the invention to build a filter of a given type and a given damping factor, in compliance with the invention.

It should be noted that the shift registers employed must be of a minimum length given by $n+r-2$ if r is the number of bits corresponding to the filter output dynamic characteristic.

The embodiments of the invention based on a series-mounted canonic structure offer the advantage of restricting the material used to a minimum. In particular, the problem of the sign extension of the shifted samples is very simply resolved.

The application of the filter to very low cut-off frequencies is achieved by simply extending the two shift registers, the input and output adders not being modified, which is not the case for parallel-mounted arrangements.

The filters with canonic structures described are built using logical circuits currently available on the market and consisting of practically only two types of circuit, namely of series adders and shift registers.

Certain modifications can be devised by those familiar with the subject matter while remaining within the spirit of the invention. For this reason the scope of this invention is limited only by the claims appended hereto.

What I claim is:

1. A recursive digital filter deriving the samples of a filtered output signal at a present sampling instant from the samples of an input signal to be filtered at said present sampling instant and at two preceding consecutive sampling instants and from the samples of said filtered output signal at said two preceding consecutive sampling instants, said recursive digital filter comprising:

first memory means for storing the samples of the input signal at said present sampling instant and preceding consecutive sampling instants;

second memory means for storing the samples of the filtered output signal at said present sampling instant and preceding consecutive sampling instants;

a digital adder means;

means for the output of said digital adder means to connecting said second memory means;

a first digital multiplier means for multiplying the samples of the input signal comprising at most two first multiplier units inserted between the part of said first memory means storing the sample of the input signal at the present sampling instant and said digital adder means, at most three second multiplier units inserted between the part of said first memory means storing the sample of the input signal at the first preceding sampling instant and said digital adder means, and at most two third multiplier units inserted between the part of said first memory means storing the sample of the input signal at the second preceding sampling instant and said digital adder means, all said multiplier units of said first digital multiplier means being power of two multiplier units;

a second digital multiplier means for multiplying the samples of the filtered output signal, comprising two first multiplier units connected in parallel and inserted between the part of said second memory means storing the sample of the filtered output signal at the first preceding sampling instant and said digital adder means and three second multiplier units connected in parallel and inserted between the part of said second memory means storing the sample of the filtered output signal at the second preceding sampling instant and said digital adder means, all said multiplier units of said second multiplier means being power of two multiplier units; and a third digital multiplier means comprising a single multiplier unit inserted between said digital adder means and the recursive digital filter output, said single multiplier unit being a multiplier unit by $2^{-n}$, where n is a positive integer at least equal to 5.

2. A recursive digital filter as set forth in claim 1, in which the first digital multiplier means comprises:

a single first multiplier unit by $2^0$;

a single second multiplier unit by $2^1$;

a single third multiplier unit by $2^0$;

and the second digital multiplier means comprises:

two first multiplier units by $2^{n+1}$ and $-2^{(n+3)/2}$ respectively;

three second multiplier units by $-2^n$, $2^{(n+3)/2}$ and $-2^2$ respectively;

n being an odd integer and said connecting means connecting the part of said second memory means storing the sample of the filtered output signal at the present sampling instant with the recursive digital filter output.

3. A recursive digital filter as set forth in claim 1, in which the first digital multiplier means comprises:

a single first multiplier unit by $2^n$;

a single second multiplier unit by $-2^{(n+1)}$;

a single third multiplier unit by $2^n$;

and the second digital multiplier means comprises:

two first multiplier units by $2^{(n+1)}$ and $-2^{(n+3)/2}$ respectively;

three second multiplier units by $-2^n$, $2^{(n+3)/2}$ and $-2^2$ respectively;

n being an odd integer and said connecting means connecting the part of said second memory means storing the sample of the filtered output signal at the present sampling instant with the recursive digital filter output.

4. A recursive digital filter as set forth in claim 1, in which the first digital multiplier means comprises:

a single first multiplier unit by $2^n$;

two parallel connected second multiplier units by $-2^{(n+1)}$ and $2^2$ respectively;

a single third multiplier unit by $2^n$;

and the second digital multiplier means comprises:

two first multiplier units by $2^{(n+1)}$ and $-2^{(n+3)/2}$ respectively;

three second multiplier units by $-2^n$, $2^{(n+3)/2}$ and $-2^2$ respectively;

n being an odd integer and said connecting means connecting the part of said second memory means storing the sample of the filtered output signal at the present sampling instant with the recursive digital filter output.

5. A recursive digital filter as set forth in claim 1, in which the first digital multiplier means comprises:

a single first multiplier unit by $2^0$;

a single second multiplier unit by $2^1$;

a single third multiplier unit by $2^0$; and the second digital multiplier means comprises:

two first multiplier units by $2^1$ and $-2^{(3-n)/2}$ respectively three second multiplier units by $-2^0$, $2^{(3-n)/2}$ and $-2^{(2-n)}$ respectively;

n being an odd integer and said connecting means connecting the part of said second memory means storing the sample of the filtered output signal at the present sampling instant with the digital adder means output.

6. A recursive digital filter as set forth in claim 1, in which the first digital multiplier means comprises:

a single first multiplier unit by $2^n$;

a single second multiplier unit by $-2(n+1)$;

a single third multiplier unit by $2^n$;

and the second digital multiplier means comprises:

two first multiplier units by $2^1$ and $-2^{(3-n)/2}$ respectively;

three second multiplier units by $-2^0$, $2^{(3-n)/2}$ and $-2^{(2-n)}$ respectively;

n being and odd integer and said connecting means connecting the part of said second memory means storing the sample of the filtered output signal at the present sampling instant with the digital adder means output.

7. A recursive digital filter as set forth in claim 1, in which the first digital multiplier means comprises:

a single first multiplier unit by $2^n$;

two parallel connected second multiplier units by $-2^{(n+1)}$ and $2^2$, respectively;

a single third multiplier unit by $2^n$;

and the second digital multiplier means comprises:

two first multiplier units by $2^1$ and $-2^{(3-n)/2}$ respectively;

three second multiplier units by $-2^0$, $2^{(3-n)/2}$ and $-2^{(2-n)}$ respectively;

n being an odd integer and said connecting means connecting the part of said second memory means storing the sample of the filtered output signal at the present sampling instant with the digital adder means output.

8. A recursive digital filter as set forth in claim 1, in which the first digital multiplier means further comprises a function selector for switching said filter to any one of three low-pass, and high-pass and rejection positions, said function selector switched to the low-pass position selecting:

a single first multiplier unit by $2^0$;

a single second multiplier unit by $2^1$;

a single third multiplier unit by $2^0$;

said function selector switched to the high-pass position selecting:

a single first multiplier unit by $2^n$;

a single second multiplier unit by $-2^{(n+1)}$;

a single third multiplier unit by $2^n$; said function selector switched to the rejection position selecting:

a single first multiplier unit by $2^n$;

two parallel connected second multiplier units by $-2^{(n+1)}$ and $2^2$ respectively;

a single third multiplier unit by $2^n$;

and the second digital multiplier means comprises:

two first multiplier units by $2^{(n+1)}$ and $-2^{(n+3)/2}$ respectively;

three second multiplier units by $-2^n$, $2^{(n+3)/2}$ and $-2^2$ respectively;

n being an odd integer and said connecting means connecting the part of said second memory means storing the sample of the filtered output signal at the present sampling instant with the recursive digital filter output.

9. A recursive digital filter as set forth in claim 1, in which the first digital multiplier means further comprises a function selector for switching said filter to any one of three low-pass, high-pass and rejection positions, said function selector switched to the low-pass position selecting:

a single first multiplier unit by $2^0$;

a single second multiplier unit by $2^1$;

a single third multiplier unit by $2^0$;

said function selector switched to the high-pass position selecting:

a single first multiplier unit by $2^n$;

a single second multiplier unit by $-2^{(n+1)}$;

a single third multiplier unit by $2^n$;

said function selector switched to the rejection position selecting:

a single first multiplier unit by $2^n$;

two parallel connected second multiplier units by $-2^{(n+1)}$ and $2^2$ respectively;

a single third multiplier unit by $2^n$;

and the second digital multiplier means comprises:

two first multiplier units by $2^1$ and $-2^{(3-n)/2}$ respectively;

three second multiplier units by $-2^0$, $2^{(3-n)/2}$ and $-2^{(2-n)}$ respectively;

n being an odd integer and said connecting means connecting the part of said second memory means storing the sample of the filtered output signal at the present sampling instant with the digital adder means output.

10. A recursive digital filter as set forth in claim 1, in which the first digital multiplier means further comprises a function selector for switching said filter to any one of three low-pass, high-pass and rejection positions, and a gain selector, said gain being determined by the selection of an integer k, said function selector switched to the low-pass position selecting:
a single first multiplier unit by $2^k$;
a single second multiplier unit by $2^{(k+1)}$;
a single third multiplier unit by $2^k$;

said function selector switched to the high-pass position selecting:
a single first multiplier unit by $2^k$;
a single second multiplier unit by $-2^{(k+1)}$;
a single third multiplier unit by $2^k$;

said function selector switched to the rejection position selecting;
a single first multiplier unit by $2^k$;
two parallel connected second multiplier units $-2^{(k+1)}$ and $2^{k-n+2}$ respectively;
a single third multiplier unit by $2^k$;
and the second digital multiplier means comprises:
two first multiplier units by $2^{(n+1)}$ and $-2^{(n+3)/2}$ respectively;
three second multiplier units by $-2^n$, $2^{(n+3)/2}$ and $-2^2$ respectively;
n being an odd integer and
said connecting means connecting the part of said second memory means storing the sample of the filtered output signal at the present sampling instant with the recursive digital filter output.

11. A recursive digital filter as set forth in claim 1, in which the first digital multiplier means further comprises a function selector for switching said filter to any one of three low-pass, high-pass and rejection positions, and a gain selector, said gain being determined by the selection of an integer k, said function selector switched to the low-pass position selecting:
a single first multiplier unit by $2^k$;
a single second multiplier unit by $2^{(k+1)}$;
a single third multiplier unit by $2^k$;

said function selector switched to the high-pass position selecting:
a single first multiplier unit by $2^k$;
a single second multiplier unit by $-2^{(k+1)}$;
a single third multiplier unit by $2^k$;

said function selector switched to the rejection position selects:
a single first multiplier unit by $2^k$;
two parallel connected second multiplier units by $-2^{(k+1)}$ and $2^{k-n+2}$, respectively;
a single third multiplier unit by $2^k$;
and the second digital multiplier means comprises:
two first multiplier units by $2^1$ and $-2^{(3-n)/2}$ respectively;
three second multiplier units by $-2^0$, $2^{(3-n)/2}$ and $-2^{(2-n)}$ respectively;
n being and odd integer and
said connecting means connecting the part of said second memory means storing the sample of the filtered output signal at the present sampling instant with the digital adder means output.

12. A recursive digital filter deriving the samples of a filtered output signal at a present sampling instant from the samples of an input signal to be filtered at said present sampling instant and at the preceding consecutive sampling instant and from the sample of said filtered output signal at said preceding consecutive sampling instant, said recursive digital filter comprising:

first memory means for storing the samples of the input signal at said present sampling instant and preceding consecutive sampling instant;
second memory means for storing the samples of the filtered output signal at said present sampling instant and preceding consecutive instant;
a digital adder means;
means for connecting the output of said digital adder to said second memory means;
a first digital multiplier means for multiplying the samples of the input signal comprising a single first multiplier unit inserted between the part of said first memory means storing the sample of the input signal at the present sampling instant and said digital adder means and a single second multiplier unit inserted between the part of said first memory means storing the sample of the input signal at the preceding sampling instant and said digital adder means;
a second digital multiplier means for multiplying the samples of the filtered output signal, comprising two multiplier units inserted between the part of said second memory means storing the sample of the filtered output signal at the preceding sampling instant and said digital adder means;
all said multiplier units being power of two multiplier units; and
a third digital multiplier means comprising a single multiplier unit inserted between said digital adder means and the recursive digital filter output, said single multiplier unit being a multiplier unit by a $2^{-n}$, where n is a positive integer at least equal to 5.

13. A recursive digital filter as set forth in claim 12, in which the first digital multiplier means comprises:
a single first multiplier unit by $2^0$;
a single second multiplier unit by $2^0$;
and the second digital multiplier means comprises:
two multiplier units by $2^n$ and $-2^1$ respectively;
said connecting means connecting the part of said second memory means storing the sample of the filtered output signal at the present sampling instant with the recursive digital filter output.

14. A recursive digital filter as set forth in claim 12, in which the first digital multiplier means comprises:
a single first multiplier unit by $2^n$;
a single second multiplier unit by $-2^n$;
and the second digital multiplier means comprises:
two multiplier units by $2^n$ and $-2^1$, respectively;
said connecting means connecting the part of said second memory means storing the sample of the filtered output signal at the present sampling instant with the recursive digital filter output.

15. A recursive digital filter as set forth in claim 12, in which the first digital multiplier means comprises:
a single first multiplier unit by $2^0$;
a single second multiplier unit by $2^0$;
and the second digital multiplier means comprises:
two multiplier units by $2^0$ and $-2^{1-n}$, respectively;
said connecting means connecting the part of said second memory means storing the sample of the filtered output signal at the present sampling instant with the digital adder means output.

16. A recursive digital filter as set forth in claim 12, in which the first digital multiplier means comprises:
a single first multiplier unit by $2^n$;
a single second multiplier unit by $-2^n$;
and the second digital multiplier means comprises:
two multiplier units by $2^0$ and $-2^{1-n}$, respectively;

said connecting means connecting the part of said second memory means storing the sample of the filtered output signal at the present sampling instant with the digital adder means output.

17. A recursive digital filter as set forth in claim 1, in which said power of two multiplier units are shift registers, when the power of two is different from $2^0$, said shift registers being connected with the outputs of said first and second memory means for shifting the bits of the samples stored therein by a number of binary weights equal to the exponent of the power of two, and, when the power of two is equal to $2^0$, said power of two multiplier units are direct connection lines.

18. A recursive digital filter as set forth in claim 12, in which said power of two multiplier units are shift registers, when the power of two is different from $2^0$, said shift registers being connected with the outputs of said first and second memory means for shifting the bits of the samples stored therein by a number of binary weights equal to the exponent of the power of two, and, when the power of two is equal to $2^0$, said power of two multiplier units are direct connection lines.

19. A recursive digital filter as set forth in claim 1, in which said power of two multiplier units are composed by a data transfer "bus" line, including a plurality of wires conveying sample bits according to the respective binary weights thereof, inserted between the outputs of said first and second memory means and said digital adder means, each wire being connected to an output of the memory means according respectively to the binary weight of the bits stored therein and an input of the digital adder means according respectively to the binary weight of the bits applied thereto, algebraically increased by the exponent of the power of two.

20. A recursive digital filter as set forth in claim 12, in which said power of two multiplier units are composed by a data transfer "bus" line, including a plurality of wires conveying sample bits according to the respective binary weights thereof, inserted between the outputs of said first and second memory means and said digital adder means, each wire being connected to an output of the memory means according respectively to the binary weight of the bits stored therein and an input of the digital adder means according respectively to the binary weight of the bits applied thereto, algebraically increased by the exponent of the power of two.

21. A recursive digital filter deriving the samples of a filtered output signal at a present sampling instant from the samples of an intermediate signal at said present sampling instant and at two preceding consecutive sampling instants, and deriving the samples of said intermediate signal at said present sampling instant from the samples of an input signal to be filtered at said present sampling instant and from the samples of said intermediate signal at said two preceding consecutive sampling instants, said recursive digital filter comprising:
a first shift register for shifting the samples of said intermediate signal at said present sampling instant;
a second shift register for shifting the samples of said intermediate signal at said first preceding sampling instant, said second shift register being series connected with said first shift register;
a first digital adder means, having an input of which receiving the samples of said input signal at said present sampling instant;
second digital adder means;
means for connecting the output of said first digital adder means to the input of said first shift register;

a first digital multiplier means for multiplying the samples of the intermediate signal comprising a first multiplier unit inserted between the output of said first digital adder means giving the sample of the intermediate signal at the present sampling instant and said second digital adder means, at most two second multiplier units inserted between outputs of said first shift register giving the sample of the intermediate signal at the first preceding sampling instant and said second digital adder means, and a third multiplier unit inserted between the output of said second shift register giving the sample of the intermediate signal at the second preceding sampling instant and said second digital adder means, all said multiplier units of said first digital multiplier means being power of two multiplier units;
a second digital multiplier means for multiplying the samples of the intermediate sgnal, comprising at most three free multiplier units inserted between outputs of said first shift register giving the sample of the intermediate signal at the first preceding sampling instant and said first digital adder means and at most three second multiplier units inserted between outputs of said second shift register giving the sample of the intermediate signal at the second preceding sampling instant and said first digital adder means, all said multiplier units of said second multiplier means being power of two multiplier units; and
a third digital multiplier means comprising a single multiplier unit inserted between the output of said second digital adder means and the recursive digital filter output, said single multiplier unit being a multiplier unit by $2^{-n}$, where n is a positive integer at least equal to 5.

22. A recursive digital filter as set forth in claim 21, in which said power of two multiplier units are direct connection lines, when the power of two is equal to $\pm 2^0$, and, when the power of two is equal to $\pm 2^{-p}$, where p is a positive integer, said power of two multiplier unit comprises:
shifted output connection of said corresponding shift register, the shift of the shifted output connection being equal to p;
sign memory means for memorizing the sign of the information contained in the shift register at the moment when this sign arrives at said shifted output and transmitting said sign to the corresponding digital adder means, for the whole sequence of bit shifts, said sign memory means being inserted between said shifted output connection and an input of the corresponding digital adder means which is of the same signl as $\pm 2^{-p}$.

23. A recursive digital filter as set forth in claim 21, in which each of said multiplier units by $\pm 2^1$ is a simple flip-flop set initially at zero and being inserted between the output of the corresponding shift register and an input of the corresponding digital adder means which is of the same sign as $\pm 2^1$.

24. A recursive digital filter as set forth in claim 21, said filter having a damping factor equal to $2^{k/2}$, where k is an integer of same parity as n, in which the first digital multiplier means comprises:
a first multiplier unit by $2^0$;
a single second multiplier unit by $2^1$;
a third multiplier unit by $2^0$;
and the second digital multiplier means comprises:

three first multiplier units by $2^1$, $-2^{(k+4-n)/2}$ and $\epsilon_1 2^{-n}$ respectively;

three second multiplier units by $-2^0$, $2^{(k+4-n)/2}$ and $-\epsilon_2 2^{-n}$ respectively;

the value of the pair ($\epsilon_1$, $\epsilon_2$) being selected from the group $(-4,0)$, $(-2, +2)$, $(0, +4)$ and $(+4, +8)$;

said multiplier units by $\pm 2^{(k+4-n)/2}$, $\epsilon_1 2^{-n}$ and $-\epsilon_2 2^{-n}$ of the second digital multiplier means, being a disconnection or a suppression of the corresponding shift register shifted output when the related power of two is equal to zero, this zero value being obtained by $\epsilon_1=0$, $\epsilon_2=0$ and $k=-\infty$.

25. A recursive digital filter as set forth in claim 21, said filter having a damping factor equal to $2^{k/2}$, where k is an integer of same parity as n, in which the first digital multiplier means comprises:

a first multiplier unit by $2^0$;
a single second multiplier unit by $-2^1$;
a third multiplier unit by $2^0$;
and the second digital multiplier means comprises:
three first multiplier units by $2^1$, $-2^{(k+4-n)/2}$ and $\epsilon_1 2^{-n}$ respectively;
three second multiplier units by $-2^0$, $2^{(k+4-n)/2}$ and $-\epsilon_2 2^{-n}$ respectively;

the value of the pair ($\epsilon_1$, $\epsilon_2$) being selected from the group $(-4,0)$, $(-2, +2)$, $(0, +4)$ and $(+4, +8)$;

said multiplier units by $\pm 2^{(k+4-n)/2}$, $\epsilon_1 2^{-n}$ and $-\epsilon_2 2^{-n}$ of the second digital multiplier means, being a disconnection or a suppression of the corresponding shift register shifted output when the related power of two is equal to zero, this zero value being obtained by $\epsilon_1=0$, $\epsilon_2=0$, and $k=-\infty$;

said filter further comprising a fourth digital multiplier means including a single multiplier unit by $2^n$ placed upstream of said first digital adder means input which receives the samples of said input signal.

26. A recursive digital filter as set forth in claim 21, said filter having a damping factor equal to $2^{k/2}$, where k is an integer of same parity as n, in which the first digital multiplier means comprises:

a first multiplier unit by $2^0$;
two second multiplier units by $-2^1$ and $2^{2-n}$, respectively;
a third multiplier unit by $2^0$;
and the second digital multiplier means comprises:
three first multiplier units by $2^1$, $-2^{(k+4-n)/2}$ and $\epsilon_1 2^{-n}$ respectively;
three second multiplier units by $-^0$, $2^{(k+4-n)/2}$ and $-\epsilon_2 2^{-n}$ respectively;

the value of the pair ($\epsilon_1$, $\epsilon_2$) being selected from the group $(-4,0)$, $(-2, +2)$, $(0, +4)$ and $(+4, +8)$;

said multiplier units by $\pm 2^{(k+4-n)/2}$, $\epsilon_1 2^{-n}$ and $-\epsilon_2 2^{-n}$ of the second digital multiplier means, being a disconnection or a suppression of the corresponding shift register shifted output when the related power of two is equal to zero, this zero value being obtained by $\epsilon_1=0$, $\epsilon_2=0$, and $k=-\infty$, said filter further comprising a fourth digital multiplier means including a single multiplier unit by $2^n$ placed upstream of said first digital adder means input which receives the samples of said input signal.

27. A recursive digital filter as set forth in claim 21, said filter being a low-pass filter with damping factor equal to zero, in which the first digital multiplier means comprises:

a first multiplier unit by $2^0$;
a single second multiplier unit by $2^1$;
a third multiplier unit by $2^0$;
and the second digital multiplier means comprises:
two first multiplier units by $2^1$ and $-2^{-n+2}$ respectively;
a single second multiplier unit by $-2^0$.

28. A recursive digital filter as set forth in claim 21, said filter being a low-pass filter with damping factor equal to $\frac{1}{2}$, in which the first digital multiplier means comprises:

a first multiplier unit by $2^0$;
a single second multiplier unit by $2^1$;
a third multiplier unit by $2^0$;
and the second digital multiplier means comprises:
three first multiplier units by $2^1$, $-2^{(2-n)/2}$ and $-2^{-n+2}$ respectively;
two second multiplier units by $-2^0$ and $2^{(2-n)/2}$ respectively;
n being an even integer.

29. A recursive digital filter as set forth in claim 21, said filter being a Butterworth low-pass filter with damping factor equal to $1/\sqrt{2}$, in which the first digital multiplier means comprises:

a first multiplier unit by $2^0$;
a single second multiplier unit by $2^1$;
a third multiplier unit by $2^0$;
and the second digital multiplier means comprises:
three first multiplier units by $2^1$, $-2^{(3-n)/2}$ and $-2^{-n+1}$ respectively;
three second multiplier units by $-2^0$, $2^{(3-n)/2}$ and $-2^{-n+1}$, respectively; n being an odd integer.

30. A recursive digital filter as set forth in claim 21, said filter being a Butterworth low-pass filter with damping factor equal to $1/\sqrt{2}$, in which the first digital multiplier means comprises:

a first multiplier unit by $2^0$;
a single second multiplier unit by $2^1$;
a third multiplier unit by $2^0$;
and the second digital multiplier means comprises:
two first multiplier units by $2^1$ and $-2^{(3-n)/2}$ respectively;
three second multiplier units by $-2^0$, $2^{(3-n)/2}$ and $-2^{-n+2}$ respectively;
n being an odd integer.

31. A recursive digital filter as set forth in claim 21, said filter being a low-pass filter with damping factor equal to unity, in which the first digital multiplier means comprises:

a first multiplier unit by $2^0$;
a single second multiplier unit by $2^1$;
a third multiplier unit by $2^0$;
and the second digital multiplier means comprises:
two first multiplier units by $2^1$ and $-2^{(4-n)/2}$ respectively;
three second multiplier units by $-2^0$, $2^{(4-n)/2}$ and $-2^{-n+2}$ respectively;
n being an even integer.

32. A recursive digital filter as set forth in claim 21, said filter being a high-pass filter with damping factor equal to $1/\sqrt{2}$, in which the first digital multiplier means comprises:

a first multiplier unit by $2^0$;
a single second multiplier unit by $-2^1$;
a third multiplier unit by $2^0$;
and the second digital multiplier means comprises:
three first multiplier units by $2^1$, $-2^{(3-n)/2}$ and $-2^{-n+1}$ respectively;

three second multiplier units by $-2^0$, $2^{(3-n)/2}$ and $-2^{-n+1}$ respectively;

n being an odd integer, and said filter further comprising a fourth digital multiplier means including a single multiplier unit by $2^n$ placed upstream of said first digital adder means input which receives the samples of said input signal.

33. A recursive digital filter as set forth in claim 21, said filter being a high-pass filter with damping factor equal to $1/\sqrt{2}$, in which the first digital multiplier means comprises:

a first multiplier unit by $2^0$;

a single second multiplier unit by $-2^1$;

a third multiplier unit by $2^0$;

and the second digital multiplier means comprises:

two first multiplier units by $2^1$ and $-2^{(3-n)/2}$, respectively;

three second multiplier units by $-2^0$, $2^{(3-n)/2}$ and $-2^{-n+2}$ respectively;

n being an odd integer, and said filter further comprising a fourth digital multiplier means including a single multiplier unit by $2^n$ placed upstream of said first digital adder means input which receives the samples of said input signal.

34. A recursive digital filter as set forth in claim 21, said filter being a rejection filter with damping factor equal to $1/\sqrt{2}$, in which the first digital multiplier means comprises:

a first multiplier unit by $2^0$;

two second multiplier units by $-2^1$ and $2^{2-n}$ respectively;

a third multiplier unit by $2^0$; and the second digital multiplier means comprises:

three first multiplier units by $2^1$, $-2^{(3-n)/2}$ and $-2^{-n+1}$ respectively;

three second multiplier units by $-2^0$, $2^{(3-n)/2}$ and $-2^{-n+1}$ respectively;

n being an odd integer, and said filter further comprising a fourth digital multiplier means including a single multiplier unit by $2^n$ placed upstream of said first digital adder means input which receives the samples of said input signal.

35. A recursive digital filter as set forth in claim 21, said filter being a rejection filter with damping factor equal to $1/\sqrt{2}$, in which the first digital multiplier means comprises:

a first multiplier unit by $2^0$;

two second multiplier units by $-2^1$ and $2^{2-n}$ respectively;

a third multiplier unit by $2^0$;

and the second digital multiplier means comprises:

two first multiplier units by $2^1$ and $-2^{(3-n)/2}$ respectively;

three second multiplier units by $-2^0$, $2^{(3-n)/2}$ and $-2^{-n+2}$ respectively;

n being an odd integer, and said filter further comprising a fourth digital multiplier means including a single multiplier unit by $2^n$ placed upstream of said first digital adder means input which receives the samples of said input signal.

36. A recursive digital filter as set forth in claim 21, said filter being switchable to any one of three low-pass, high-pass and rejection positions and having a damping factor equal to $2^{k/2}$, where k is an integer of same parity as n, in which the first digital multiplier means comprises:

a first multiplier unit by $2^0$;

two second multiplier units by $2^1$ and $2^{2-n}$ respectively;

a third multipler unit by $2^0$;

and the second digital multiplier means comprises:

three first multiplier units by $2^1$, $-2^{(k+4-n)/2}$ and $\epsilon_1 2^{-n}$ respectively;

three second multiplier units by $-2^0$, $2^{(k+4-n)/2}$ and $-\epsilon_2 2^{-n}$ respectively;

the value of the pair ($\epsilon_1$, $\epsilon_2$) being chosen in the group $(-4,0)$, $(-2,+2)$, $(0,+4)$ and $(+4,+8)$;

said filter further comprising:

five switches for selectively connecting and disconnecting the five multiplier units by $2^{2-n}$, $-2^{(k+4-n)/2}$, $\epsilon_1 2^{-n}$, $2^{(k+4-n)/2}$ and $-\epsilon_2 2^{-n}$ respectively, each of said switches being inserted between one of the five shifted outputs of said shift registers and the corresponding digital adder means;

a fourth digital multiplier means including two multiplier units by $2^n$ and $2^0$, respectively, said fourth digital multiplier means being placed upstream of said first digital adder means input which receives the samples of said input signal;

a two position switch for switching over either multiplier unit of said fourth digital multiplier means;

said first digital adder means having seven inputs, the input connected with said multiplier unit by $\epsilon_1 2^{-n}$ being switchable to a plus and a minus positions, said first digital adder means further comprising a two position switch for switching said switchable input;

said second digital adder means having four inputs, the input connected with said multiplier unit by $2^{2-n}$ being switchable to a plus and a minus positions, said second digital adder means further comprising a two position switch for switching said switchable input.

* * * * *

UNITED STATES PATENT AND TRADEMARK OFFICE
CERTIFICATE OF CORRECTION

PATENT NO. : 4185325
DATED : January 22, 1980
INVENTOR(S) : Jean G. Appel

It is certified that error appears in the above—identified patent and that said Letters Patent is hereby corrected as shown below:

On the title page

TITLE: Recursive digital filter having coefficients equal to sums of few powers of two terms ASSIGNEE: OFFICE NATIONAL D'ETUDES ET DE RECHERCHES AEROSPATIALES, CHATILLON-SOUS-BAGNEUX, FRANCE Signed and Sealed this Twenty-seventh Day of April 1982

|SEAL|

Attest:

GERALD J. MOSSINGHOFF

Attesting Officer     Commissioner of Patents and Trademarks